United States Patent [19]

Nakamura

[11] Patent Number: 4,956,260

[45] Date of Patent: * Sep. 11, 1990

[54] LIGHT-SENSITIVE MATERIAL CONTAINING SILVER HALIDE, REDUCING AGENT AND POLYMERIZABLE COMPOUND, AND IMAGE-FORMING METHOD EMPLOYING THE SAME

[75] Inventor: Koichi Nakamura, Minami-ashigara, Japan

[73] Assignee: Fuji Photo Film Co., Ltd., Kanagawa, Japan

[*] Notice: The portion of the term of this patent subsequent to May 23, 2006 has been disclaimed.

[21] Appl. No.: 947,312

[22] Filed: Dec. 29, 1986

[30] Foreign Application Priority Data

Dec. 26, 1985 [JP] Japan .................. 60-294337
Dec. 26, 1985 [JP] Japan .................. 60-294338
Dec. 26, 1985 [JP] Japan .................. 60-294339
Dec. 26, 1985 [JP] Japan .................. 60-294340

[51] Int. Cl.$^5$ .................. G03C 1/68; G03C 1/72
[52] U.S. Cl. .................. 430/138; 430/203; 430/254; 430/353; 430/600; 430/602; 430/603; 430/611; 430/613; 430/617; 430/619
[58] Field of Search .............. 430/600, 602, 603, 611, 430/613, 617, 619, 203, 254, 265, 353, 138

[56] References Cited

U.S. PATENT DOCUMENTS

| | | | |
|---|---|---|---|
| 3,443,948 | 5/1969 | Bryan | 430/138 |
| 3,694,252 | 5/1971 | Gerber et al. | 430/138 |
| 3,694,253 | 5/1971 | Gerber et al. | 430/138 |
| 4,629,676 | 12/1986 | Hayakawa et al. | 430/203 |
| 4,649,098 | 3/1987 | Takeda | 430/270 |
| 4,650,748 | 3/1987 | Komamura et al. | 430/548 |
| 4,656,124 | 4/1987 | Komamura | 430/548 |
| 4,833,062 | 5/1989 | Kakimi | 430/138 |

FOREIGN PATENT DOCUMENTS

59-57231 3/1984 Japan.
59-17755 9/1984 Japan.

OTHER PUBLICATIONS

Research Disclosure 17643, "Photographic Silver Halide Emulsions, ...", 2/78, Section VI, B and XXI, B and C.

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material comprising a light-sensitive layer provided on a support wherein the light-sensitive layer contains silver halide, a reducing agent, a polymerizable compound, and an additive compound selected from the group consisting of a 5- or 6-membered nitrogen containing heterocyclic compound, thiourea, a thiourea derivative, a thioether compound, polyethylene glycol and a polyethylene glycol derivative. Thermal image-forming methods utilizing the light-sensitive materials are also disclosed.

19 Claims, No Drawings

LIGHT-SENSITIVE MATERIAL CONTAINING SILVER HALIDE, REDUCING AGENT AND POLYMERIZABLE COMPOUND, AND IMAGE-FORMING METHOD EMPLOYING THE SAME

BACKGROUND OF THE INVENTION

1. Field of the Invention

This invention relates to a light-sensitive material comprising a light-sensitive layer containing silver halide, a reducing agent and a polymerizable compound provided on a support, and image-forming methods employing the light-sensitive material.

2. Description of the Prior Art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and 61(1986)-73145 (the contents of both publications are described in U.S. Patent Ser. No. 775,273 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the portion where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the content of the three publications are shown in U.S. Patent Ser. No. 827,702).

The above-mentioned image forming methods are based on the principle in which the polymerizable compound is polymerized in the portion where a latent image of the silver halide has been formed.

Further, Japanese Patent Application No. 61(1986)-243449 (corresponding to U.S. Patent Ser. No. 854,640) describes another image forming method in which the polymerizable compound in a portion where a latent image of the silver halide has not been formed is polymerized. In this method, when the material is heated, the reducing agent functions as a polymerization inhibitor in the portion where a latent image of the silver halide has been formed, and the polymerizable compound in the other portion is polymerized.

SUMMARY OF THE INVENTION

An object of the present invention is to provide a light-sensitive material which gives an image having a high contrast.

Another object of the invention is to provide a light-sensitive material which gives an image having constant sharpness regarless of variation of the processing condition, such as the heating temperature.

There is provided by the present invention a light-sensitive material in which a light-sensitive layer containing silver halide, a reducing agent and a polymerizable compound is provided on a support, characterized in that the light-sensitive layer further contains therein an additive compound selected from the group consisting of a 5- or 6-membered nitrogen containing heterocyclic compound, thiourea, a thiourea derivative, a thioether compound, a polyethylene glycol and a polyethylene glycol derivative.

The light-sensitive material of the invention can be advantageously used in a process which comprises:

imagewise exposing the light-sensitive material to form a latent image of the silver halide, and heating the light-sensitive material either simultaneously with or after the imagewise exposure to polymerize the polymerizable compound within the area where the latent image of the silver halide has been formed.

The light-sensitive material of the invention can be also advantageously used in a process which comprises:

imagewise exposing the light-sensitive material to form a latent image of the silver halide, and heating the light-sensitive material either simultaneously with or after the imagewise exposure to polymerize the polymerizable compound within the area where the latent image of the silver halide has not been formed.

The light-sensitive material of the invention is characterized in that the light-sensitive layer contains therein the above-identified additive compound.

The present inventor has found that the compound selected from the group consisting of a 5- or 6-membered nitrogen containing heterocyclic compound, thiourea, a thiourea derivative, a thioether compound, polyethylene glycol and a polyethylene glycol derivative functions as an antifogging agent or a development accelerator in the light-sensitive material of the invention. Namely, the additive compound functions for forming an image having a high contrast on the light-sensitive material. Therefore, the light-sensitive material of the invention can give a clear image having high ratio of the maximum optical density to the minimum optical density.

The additive compound also has a function of keeping the sharpness of the obtained image at a constant level regardless of variation of the processing conditions, especially heating time and the heating temperature. Therefore, the light-sensitive material of the invention can be advantageously used in an image-forming method employing heat development (i.e., thermal development).

DETAILED DESCRIPTION OF THE INVENTION

A 5- or 6-membered nitrogen containing heterocyclic compound, thiourea, a thiourea derivative, a thioether compound, polyethylene glycol, and a polyethylene glycol derivative have been known as additives for incorporation into silver halide emulsions or developing solutions in the conventional photographic technology. Various compounds including the known compounds can be used in the light-sensitive material of the present invention.

The 5- or 6-membered nitrogen-containing heterocyclic compound has one of the formulas (I-1) to (I-16) and (II-1) to (II-4):

 (I-1)

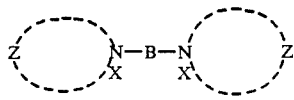 (I-2)

in which A is a monovalent group selected from the group consisting of an alkyl group, an alkenyl group, an alkynyl group, an aralkyl group, an aliphatic cyclic group and an aryl group, each of which may be substituted with another group; B is a divalent hydrocarbon group which may be substituted with another group; X is an anion; and Z is a nonmetal group which forms a 5- or 6-membered nitrogen-containing heterocyclic group together with the nitrogen atom.

Examples of B in the formula (I-2) are described below:

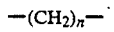 (B-1)

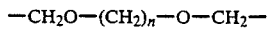 (B-2)

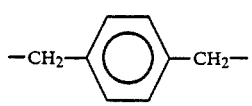 (B-3)

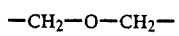 (B-4)

in which n is an integer of 1 to 12:

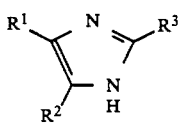 (I-3)

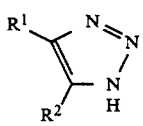 (I-4)

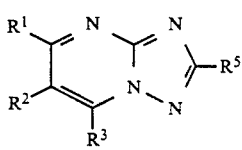 (I-5)

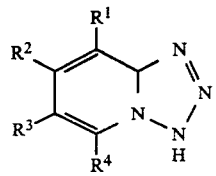 (I-6)

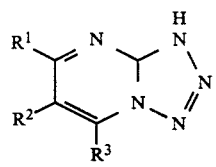 (I-7)

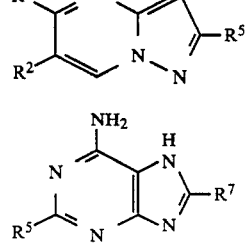 (I-8)

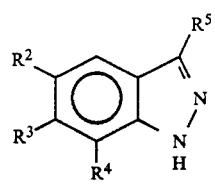 (I-9)

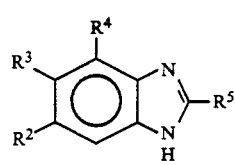 (I-10)

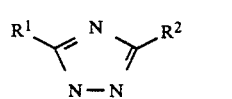 (I-11)

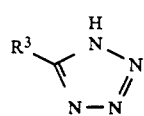 (I-12)

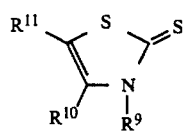 (I-13)

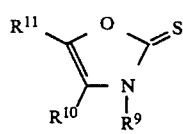 (I-14)

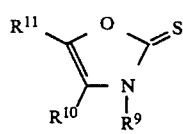 (I-15)

in which each of $R^1$, $R^2$, $R^3$ and $R^4$ individually is a monovalent group selected from the group consisting of hydrogen, an alkyl group, an aralkyl group, an alkenyl group, an alkoxy group, an aryl group, —NRR', —COOR, —SO$_3$M, —CONRR', —NHSO$_2$R, —SO$_2$NRR', —NO$_2$, a halogen atom, —CN and —OH (each of R and R' individually is a monovalent group selected from the group consisting of hydrogen, an alkyl group, an aryl group and an aralkyl group); and M is hydrogen or an alkali metal), or $R^1$ and $R^2$ together form an aliphatic cyclic group; $R^5$ is a monovalent group selected from the group consisting of hydrogen, an alkyl group containing 1-5 carbon atoms and —SR″ (R″ is a monovalent group selected from the group consisting of hydrogen, an alkyl group, an aryl group and an aralkyl group); $R^6$ is hydrogen or an alkyl group; $R^7$ is a monovalent group selected from the group consisting of hydrogen, an alkyl group and an aryl group; $R^8$ is a monovalent group selected from the group consisting of an alkyl group, an aryl group, benzyl and pyridyl; $R^9$ is a monovalent group selected from the group consisting of an alkyl group, an alkenyl group and an aryl group; and each of $R^{10}$ and $R^{11}$ individually is a monovalent group selected from the group consisting of an alkyl group, an alkenyl group and an aryl group, or $R^{10}$ and $R^{11}$ together form an aromatic group.

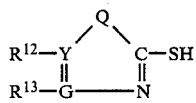
(I-16)

in which Q is a divalent group selected from the group consisting of oxygen, sulfur and —NR‴— (R‴ is a monovalent group selected from the group consisting of hydrogen, an alkyl group, an alkenyl group, an alkynyl group, an aryl group and an aralkyl group, each of which may be substituted with another group); each of Y and G individually is carbon or nitrogen; each of $R^{12}$ and $R^{13}$ individually is a monovalent group selected from the group consisting of hydrogen, an alkyl group, an alkenyl group, an alkynyl group, an aryl group, an aralkyl group, —SR″″ and —NH₂, each of which may be substituted with another group (R″″ is a monovalent group selected from the group consisting of hydrogen, alkyl group, an aryl group, an aralkyl group, an alkyl carboxylic acid, an alkali metal salt thereof, an alkyl sulfonic acid and an alkali metal salt thereof); or $R^{12}$ and $R^{13}$ together form an aromatic group when both of Y and G are carbons which may be substituted with another group.

Among these compounds having one of the formulas (I-1) to (I-16), a thiazole derivative, a diazole derivative, a triazole derivative and a tetrazole derivative (each of the rings may be condensed with benzene ring or naphthalene ring) are preferred.

Examples of the 5- or 6-membered nitrogen-containing heterocyclic compound having one of the formulas (I-1) to (I-16) are described hereinafter.

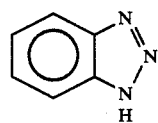
(1)

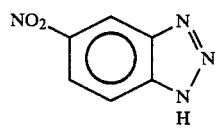
(2)

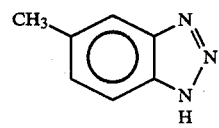
(3)

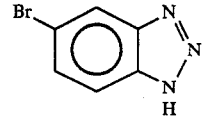
(4)

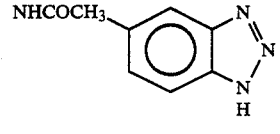
(5)

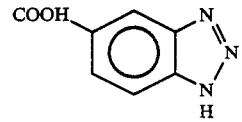
(6)

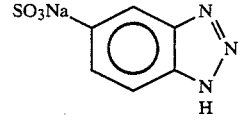
(7)

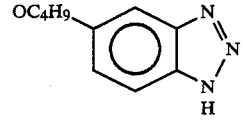
(8)

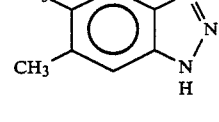
(9)

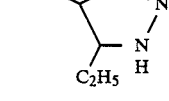
(10)

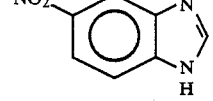
(11)

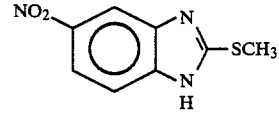
(12)

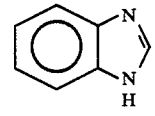
(13)

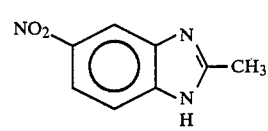
(14)

-continued
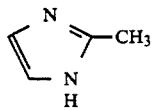 (15)
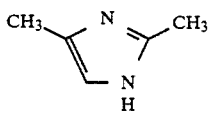 (16)
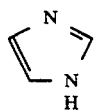 (17)
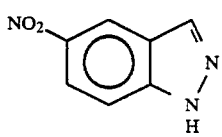 (18)
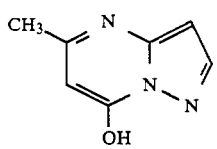 (19)
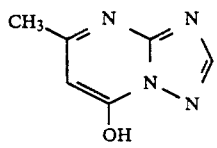 (20)
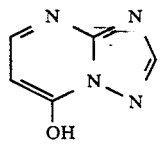 (21)
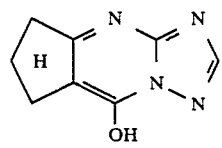 (22)
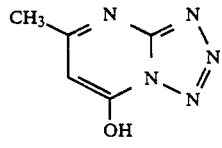 (23)
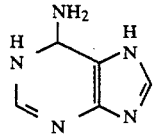 (24)
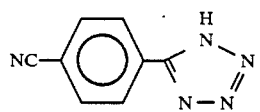 (25)
-continued
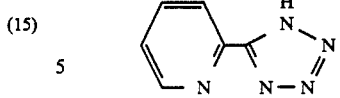 (26)
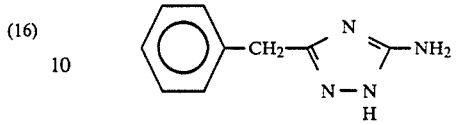 (27)
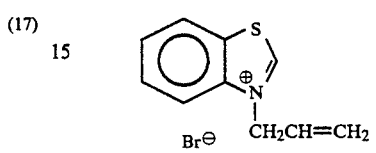 (28)
 (29)
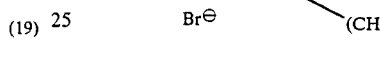 (30)
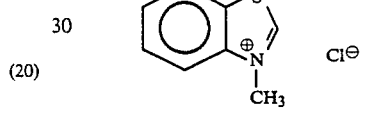 (31)
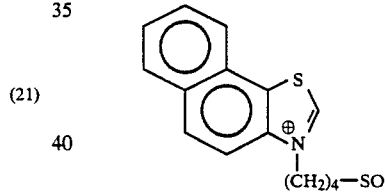 (32)
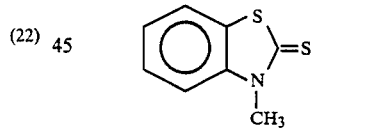 (33)
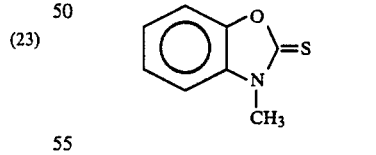 (34)
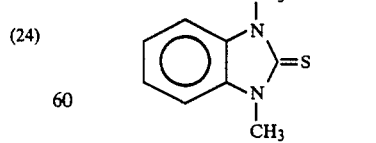 (35)
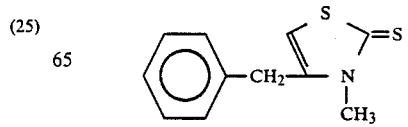

-continued
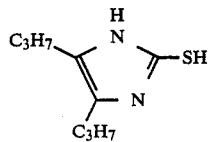 (36)
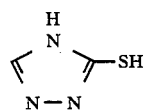 (37)
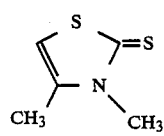 (38)
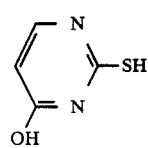 (39)
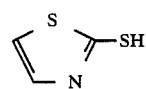 (40)
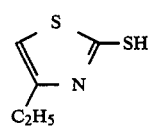 (41)
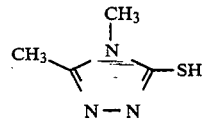 (42)
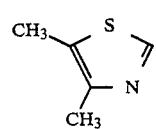 (43)
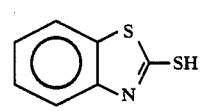 (44)
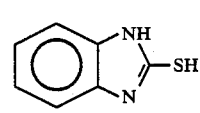 (45)
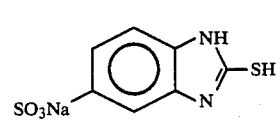 (46)
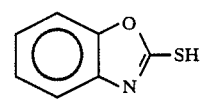 (47)
-continued
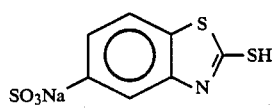 (48)
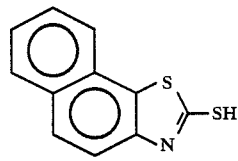 (49)
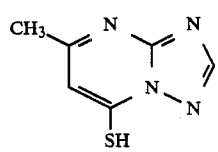 (50)
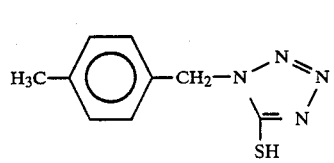 (51)
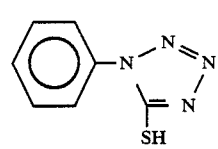 (52)
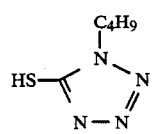 (53)
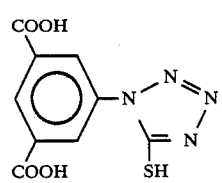 (54)
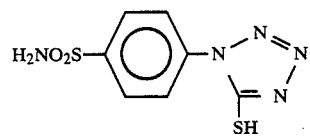 (55)
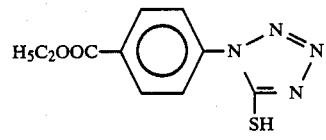 (56)
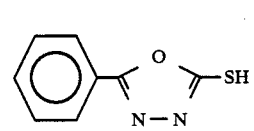 (57)
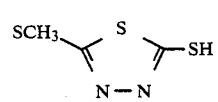 (58)

-continued
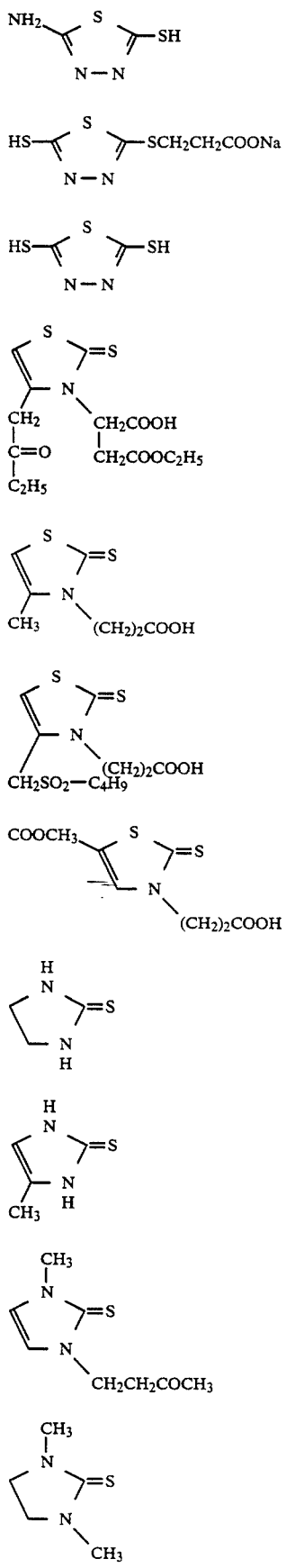
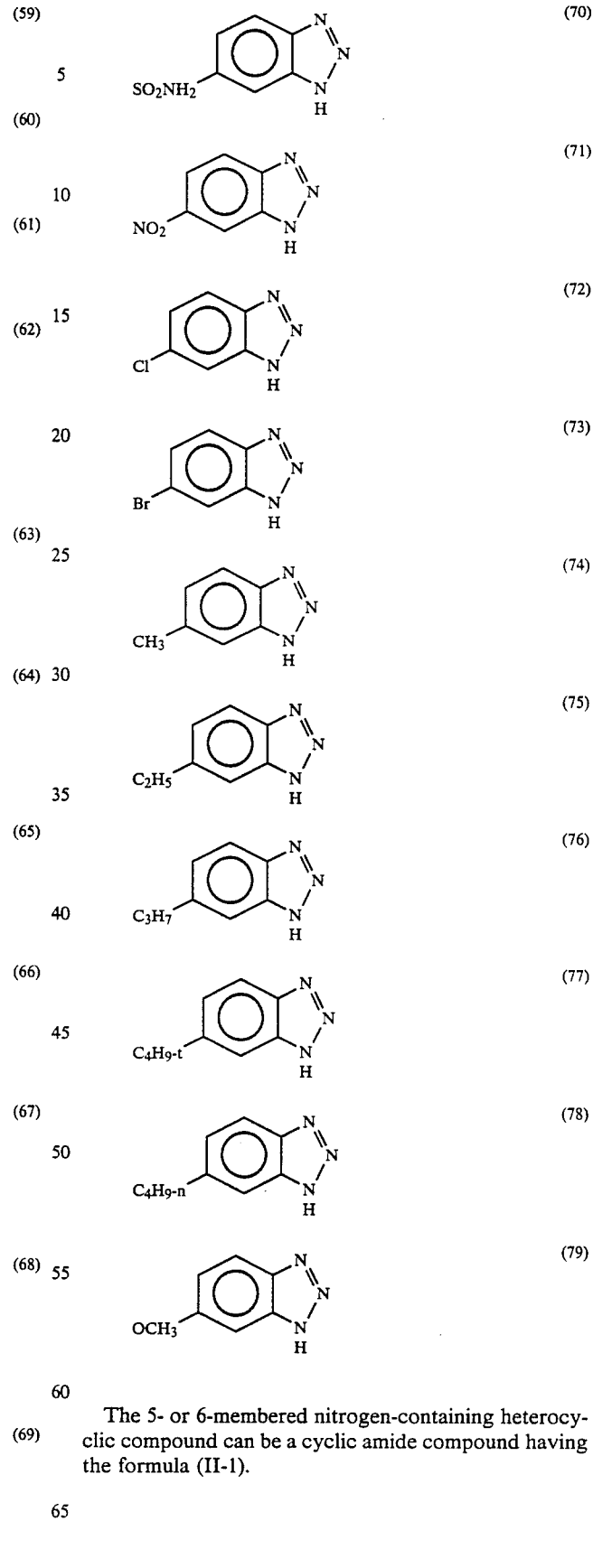
The 5- or 6-membered nitrogen-containing heterocyclic compound can be a cyclic amide compound having the formula (II-1).

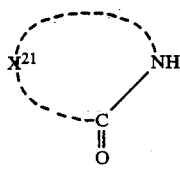
(II-1)

in which $X^{21}$ is a group which forms a 5- or 6-membered nitrogen-containing hetero ring together with —NH—CO—.

The hydrogen in the formula (II-1) can be dissociated from the amide. In this case, the cyclic amide compound may form a salt with an adequate cation.

The formed hetero ring may be either saturated or unsaturated. The $X^{21}$ may be composed of hydrocarbon, or may further contain another hetero atom (e.g., N, O, S).

The $X^{21}$ in the formula (II-1) can be substituted with one or more substituent groups. Examples of the substituent groups include an alkyl group or a substituted alkyl group (preferably containing 1-12 carbon atoms; e.g., methyl, n-butyl, t-octyl, n-dodecyl); an aralkyl group or a substituted aralkyl group (preferably containing 7-14 carbon atoms; e.g., benzyl, β-phenethyl, α-methylbenzyl); an alkoxy group (preferably containing 1-12 carbon atoms; e.g., ethoxy, methoxyethoxy); a halogen atom (chloride, bromine or iodine); and a sulfamoyl group or a substituted sulfamoyl group (preferably containing 1-12 carbon atoms; e.g., sulfamyl, dimethylsulfamoyl, octylsulfamoyl).

The hetero ring in the formula (II-1) can be condensed with another ring. Examples of the ring include a cycloalkane or a substituted cycloalkane containing 3-10 carbon atoms (e.g., cyclohexane), a cycloalkene or a substituted cycloalkene containing 3-10 carbon atoms (e.g., cyclohexene, norbornane); an aromatic ring or a substituted aromatic ring (e.g., benzene, naphthalene); and a heterocyclic ring or a substituted heterocyclic ring (e.g., imidazole, pyridine, pyridimidine, pyrazine).

Examples of the substituent group of the ring which can be condensed with the hetero ring in the formula (II-1) include a halogen atom (e.g., chlorine, bromine); an alkyl group or a substituted alkyl group containing 1-8 carbon atoms (e.g., methyl, ethyl); a sulfamoyl group or a substituted sulfamoyl group (e.g., octylsulfamoyl, diethylsulfamoyl); and an alkoxy group containing 1-8 carbon atoms (e.g., ethoxy, methoxyethoxy).

Details of the cyclic amide compound, including the preparation thereof, are described in A Cource of Experimental Chemistry, Vol. 20 (the last book) (Edited by Chemical Society of Japan, Maruzen, 1958), Heterocyclic Compounds, Vol. 1-8 (R. C. Elderfield, John Wiley & Sons) and The Chemistry of Hetero-Cyclic Compounds (A. Weissberger, John Wiley & Sons).

Among these compounds having the formula (II-1), a compound in which the pKa value of the hydrogen in the amide is not more than 18 is preferred. The 5- or 6-membered nitrogen containing heterocyclic compound can be a cyclic amide compound having one of the formulas (II-2) to (II-4):

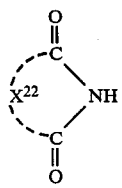
(II-2)

in which $X^{22}$ is a group which forms a 5- or 6-membered nitrogen-containing hetero ring together with —CO—NH—CO— (the formed cyclic amide can be consensed with another ring, and may be either saturated or unsaturated),

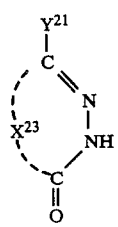
(II-3)

in which $X^{23}$ is an atom or a group which forms a 5- or 6-membered nitrogen-containing hetero ring together with —$CY^{21}$=N—NH—CO— (the formed cyclic amide can be condensed with another ring, and may be either saturated or unsaturated); and $Y^{21}$ is a monovalent group selected from the group consisting of hydrogen, an alkyl group or a substituted alkyl group, an aralkyl group or a substituted aralkyl group, an alkoxy group, a halogen atom and a sulfamoyl group or a substituted sulfamoyl group,

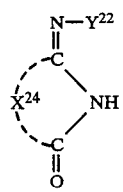
(II-4)

in which $X^{24}$ is a group which forms a 5- or 6-membered nitrogen-containing hetero ring together with —$CNY^{22}$—NH—CO— (the formed cyclic amide can be condensed with another ring, and may be either saturated or unsaturated); and $Y^{22}$ is a monovalent group selected from the group consisting of hydrogen, an alkyl group or a substituted alkyl group, an aralkyl group or a substituted aralkyl group, and an alkoxy group.

Examples of the 5- or 6-membered nitrogen-containing heterocyclic compound having one of the formula (II-1) to (II-4) (the cyclic amide compound) are described hereinafter.

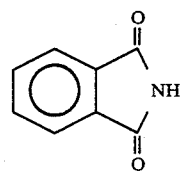
(201)

-continued (195) [structure with Br and phthalimide]

(196) [tetrachlorophthalimide]

(197) [succinimide]

(198) [morpholine-2,6-dione]

(199) [5-(N,N-diethylsulfamoyl)phthalimide]

(200) [5-(N-octylsulfamoyl)phthalimide]

(201) [2,3-dihydroquinoxaline-2,3-dione]

(209) [isatin-like structure, benzamide fused]

(210) [uracil]

(211) [naphtho-oxazinedione]

-continued (202) [phthalazinone]

(203) [1-methylphthalazinone]

(212) [benzisothiazolone dioxide]

(215) [3-iminoisoindolin-1-one]

(216) [hydantoin]

(217) [1-methylhydantoin]

(218) [1-benzylhydantoin]

(219) [3-dodecylsuccinimide]

(220) [1-methyl-1H-indazol-3(2H)-one]

(221) [benzisoxazolone]

-continued (222) 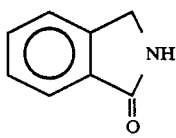

(223) 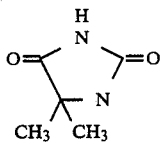

(224) 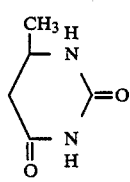

(225) 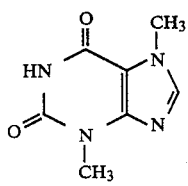

(226) 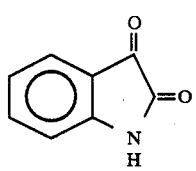

(227) 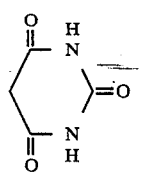

(228) 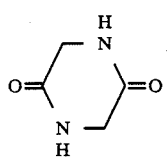

(229) 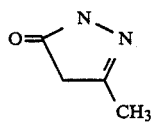

(230) 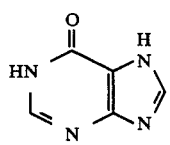

(231) 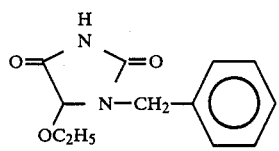

(232) 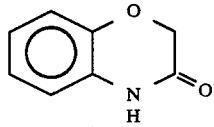

(233) 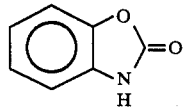

(234) 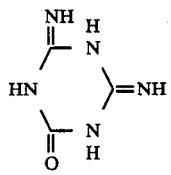

(235) 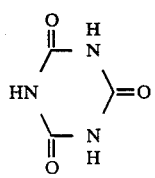

(236) 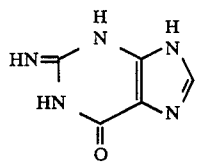

The thiourea and thiourea derivative has the formula (III):

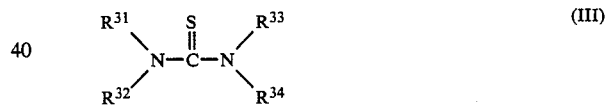

(III)

in which each of $R^{31}$, $R^{32}$, $R^{33}$ and $R^{34}$ individually is a monovalent group selected from the group consisting of hydrogen, an alkyl group, an aralkyl group an alkenyl group, an alkynyl group and an aryl group.

Each of $R^{31}$, $R^{32}$, $R^{33}$ and $R^{34}$ in the formula (III) preferably is hydrogen or an alkyl group.

Examples of the thiourea derivative having the formula (III) are described hereinafter.

 (301)

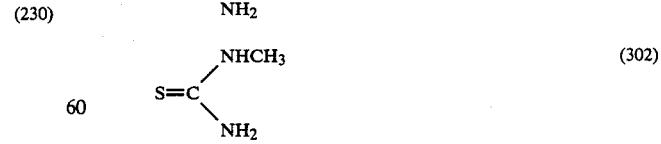 (302)

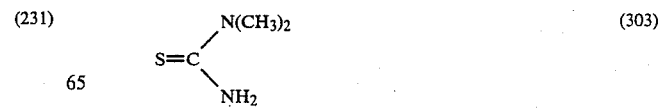 (303)

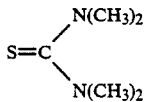 (304)

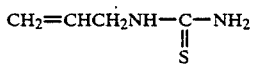 (305)

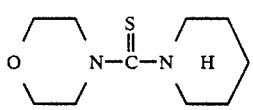 (306)

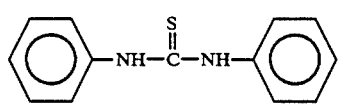 (307)

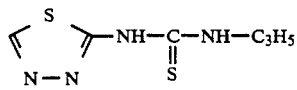 (308)

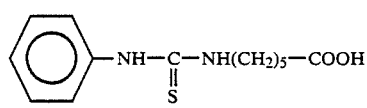 (309)

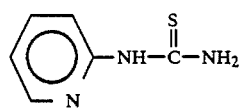 (310)

The thioether compound has the formula (IV-1):

$$R^{41}-S-R^{42} \quad (IV-1)$$

in which each of $R^{41}$ and $R^{42}$ individually is a monovalent group selected from the group sonsisting of an aliphatic group, an aromatic group and a heterocyclic group, each of which may be sustituted with another group.

Examples of the aliphatic group include an alkyl group (preferably containing 1-22 carbon atoms), a cycloalkyl group (e.g., cyclohexyl), an alkenyl group (preferably containing 1-22 carbon atoms), an alkynyl group (preferably containing 1-22 carbon atoms), and an aralkyl group (e.g., benzyl, phenethyl, tolubenzyl, naphthylmethyl). The hydrocarbon chain in the aliphatic group may be either a straight chain or a branched chain.

Examples of the aromatic group include aryl groups (e.g., phenyl, naphthyl, dodecylphenyl).

The heterocyclic group preferably is a 5- or 6-membered heterocyclic group containing nitrogen, oxygen or sulphur as the heteroatom. The heterocyclic group may be a condensed ring. Examples of the heteroring in the heterocyclic group include imidazole, pyrazole, thiazole, thiadiazole, triazole, indazole, benzimidazole, benzotriazole.

Examples of the substituent group of the aliphatic group, the aromatic group and the heterocyclic group include a halogen atom (e.g., chlorine, bromine, fluorine), —CN, —NR$^{43}$R$^{44}$, —COOR$^{43}$, —CONR$^{43}$R$^{44}$, —NHCOR$^{43}$, —NHSO$_2$R$^{43}$, —SO$_2$NR$^{43}$R$^{44}$, —NO$_2$, —OH, —SR$^{43}$, —SO$_3$M, —OR$^{43}$, —SO$_2$R$^{43}$ and —SOR$^{43}$, in which each of R$^{43}$ and R$^{44}$ individually is a group selected from the group consisting of hydrogen, an alkyl group (preferably containing 1-22 carbon atoms), an aryl group (phenyl and a substituted phenyl group are preferred), an aralkyl group (benzyl, tolubenzyl, phenethyl and naphthylmethyl are preferred), and a heterocyclic group (e.g.,

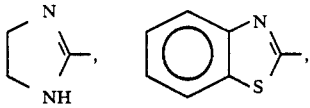

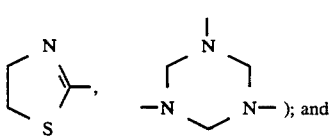 ); and

M is a cation selected from the group consisting of hydrogen ion, an alkali metal ion and ammonium ion.

The aliphatic group which can be R$^{43}$ and R$^{44}$ in the formula (IV-1) may contain the other intervening group than the hydrocarbon chain. Example of the intervening group include —O—, —S—, —SO$_2$—, 'SO$_2$NH—, —SO$_2$N<, —CONH—, —CON<, —COO— and —NR$^{45}$— (R$^{45}$ has the same meaning as that of R$^{43}$).

The thioether compound can be a compound having the formula (IV-2).

$$Y^{41}-C_nH_{2n}-(-X^{41}-C_mH_{2m}-)_p-Y^{42} \quad (IV-2)$$

in which each of $Y^{41}$ and $Y^{42}$ individually is a monovalent group selected from the group consisting of hydrogen, hydroxyl, —SO$_3$Na, —COOH, —CONH$_2$, —NH$_3$ (the hydrogen in —CONH$_2$ or —NH$_3$ may be substituted with an alkyl group or a heterocyclic group) and an aryl group which may be substituted with hydroxyl or an alkyl group; n is an integer of 0 to 20 when $Y^{41}$ is —CONH$_2$ or an aryl group, and n is an integer of 1 to 20 when $Y^{41}$ is the other group than —CONH$_2$ and the aryl group; m is an integer of 1 to 20 (the hydrogen in C$_n$H$_{2n}$ or C$_m$H$_{2m}$ may be substituted with hydroxyl or an aryl halide group); X is a divalent group selected from the group consisting of —S—, —O—, —CO—, —NHCO—, —CONH— and —COO—, and at least one of the X is —S—; and p is an integer of 1 to 5 (each of (X$^{41}$—C$_m$H$_{2m}$) may be different from each other when the p is not 1).

In the formula (IV-2), preferably, each of $Y^{41}$ and $Y^{42}$ individually is a monovalent group selected from the group consisting of hydrogen, hydroxyl, —CONH$_2$, (the hydrogen in —CONH$_2$ may be substituted with an alkyl group or a heterocyclic group) and an aryl group which may be substituted with hydroxyl or an alkyl group; n is an integer of 0 to 5 when $Y^{41}$ is —CONH$_2$ or an aryl group, and n is an integer of 1 to 4 when $Y^{41}$ is the other group than —CONH$_2$ and the aryl group; m is an integer of 1 to 5 (the hydrogen in C$_n$H$_{2n}$ or C$_m$H$_{2m}$ may be substituted with hydroxyl); X is —S—, —O—, —CO—, —NHCO—, —CONH— and —COO—, and at least one of the X is —S—; and p is 1 or 2 (each of (X$^{41}$—C$_m$H$_{2m}$) may be different from each other when the p is 2).

Examples of the thioether compound having the formula (IV-1) or (IV-2) are described hereinafter.

HO—CH₂—CH₂—CH₂—S—CH₂—CH₂—OH (401)
HO—CH₂—CH₂—CH₂—S—CH₂—CH₂—OH (402)
HO—CH₂—CH₂—CH₂—S—CH₂—CH₂—S—CH₂—CH₂—CH₂—OH (403)
HO—CH₂—CH₂—S—CH₂—CH₂—S—CH₂—CH₂—S—CH₂—CH₂—OH (404)
NaO₃S—CH₂—CH₂—CH₂—S—CH₂—CH₂—S—CH₂—CH₂—CH₂—SO₃Na (405)

HO—CH₂—CH—CH₂—S—CH₂—CH₂—S—CH₂—CH—CH₂—OH (406)
             |                                   |
             OH                                  OH

HOOC—CH₂—S—CH₂—CH₂—S—CH₂—COOH (407)
H₂NCO—CH₂—CH₂—S—CH₂—CH₂—S—CH₂—CH₂—CONH₂ (408)

CH₃NHCO—CH₂—CH₂—S—CH—S—CH₂—CH₂—CONHCH₃ (409)

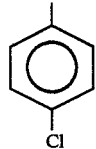

(410)

C₁₂H₂₅—S—C₁₂H₂₅ (411)
C₁₈H₃₇—S—C₁₂H₂₅ (412)

(413)

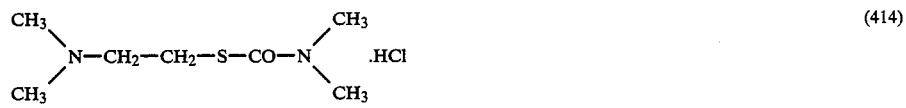
(414)

(415)

HO—CH₂—CH₂—S—CH₂—CH₂—O—CH₂—CH₂—S—CH₂—CH₂—OH (416)
HO—CH₂—CH₂—S—CH₂—CH₂—O—CH₂—CH₂—O—CH₂—CH₂—S—CH₂—CH₂—OH (417)
CH₃—CH₂—O—CH₂—CH₂—S—CH₂—CH₂—O—CH₂—CH₂—S—CH₂—CH₂—O—CH₂—CH₃ (418)

$$NH_2-\overset{O}{\underset{\|}{C}}-CH_2-CH_2-S-CH_2-CH_2-S-CH_2-CH_2-\overset{O}{\underset{\|}{C}}-NH_2$$ (419)

HO—CH₂—CH₂—S—CH₂—CO—NH—CH₂—NH—CO—CH₂—S—CH₂—CH₂—OH (420)

(421)

(422)

$$CH_3-CH_2-S-CH_2-CH_2-\overset{O}{\underset{\|}{C}}-NH_2$$ (423)

C₁₂H₂₅—O—CO—CH₂—CH₂—S—CH₂—CH₂—CO—O—C₁₂H₂₅ (424)
HO—CH₂—CH₂—S—CH₂—CH₂—OH (425)

(426)

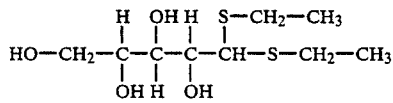
(427)

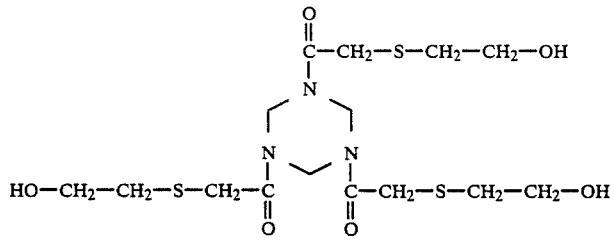
(428)

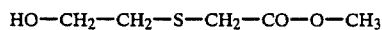
(429)

HO—CH₂—CH₂—S—CH₂—CO—O—CH₃  (429)

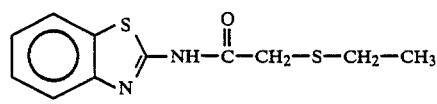
(430)

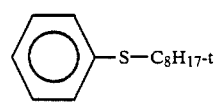
(431)

(432)

Further, the cyclic thioether compounds can also be used.

The polyethylene glycol and its derivative has the formula (V-1).

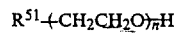  (V-1)

in which $R^{51}$ is a monovalent group selected from the group consisting of hydroxyl, an alkoxyl group, a polyalkoxy group (each alkoxy group in the polyalkoxy group contains 3 or more carbon atoms), an aryloxy group, amino, an acylamino group and acyloxy group, each of which may be substituted with another group; and n is an interger of 2 to 100 (preferably 5 to 100).

The polyethylene glycol derivative in which $R^{51}$ is a partially hydrophobic group (e.g., an alkoxy group, an aryloxy group, an N-substituted amino group, an acylamino group, an acyloxy group) is widely used as a polyethylene glycol nonionic surfactant. Therefore, this polyethylene glycol derivative can function as the surfactant in preparation of the light-sensitive material to disperse the droplets of the polymerizable compound more finely. The light-sensitive material in which the droplets of the polymerizable compound are finely dispersed has advantages of improving the sharpness in the obtained image and of reducing pigment spots within a minimum density portion (i.e., white area) when a color image forming substance is used in the light-sensitive material, because bulkyl droplets of the polymerizable compound are reduced in the material.

Details of the polyethylene glycol nonionic surfactant including the structure, the character and the preparation thereof are described in Surfactant Science Series, Volume 1, Nonionic Surfactants (Edited by Martin J. Schick, Marcel Dekker Inc. 1967) and Surface Active Ethylene Oxide Adducts (Schöufeldt. N, Pergamon Press, 1969). The nonionic surfactants described in these publications which have the above mentioned formula (V-1) can be preferably used in the invention.

The polyethylene glycol nonionic surfactants are classfied according to the structure into certain groups, such as alcohol/ethylene oxide adducts, alkylphenol/ethylene oxide adducts, fatty acid/ethylene oxide adducts, polyhydric alcohol fatty acid ester/ethylene oxide adducts, alkylamine/ethylene oxide adducts, amide of fatty acid/ethylene oxide adducts, fatty oil/ethylene oxide adducts, polypropylene glycol/ethylene oxide adducts.

Examples of the alcohol in the alcohol/ethylene oxide adducts include synthetic alcohols (compound), such as lauryl alcohol, cetyl alcohol, oleyl alcohol; and natural alcohols (mixture), such as a reduced alcohol made from a coconut oil, a reduced alcohol made from a beef tallow. Examples of the alcohol also include a methyl-branched oxoalcohol and a secondary alcohol. There is no essential difference in the functions between the compound and the mixture, and either of them is employable.

Examples of the alkylphenol in the alkylphenol/ethylene oxide adducts include nonylphenol, dodecylphenol, octylphenol, octylcresol. Either of the branched alkylphenol and the normal alkylphenol is employable.

The fatty acid/ethylene oxide adducts are known as polyethylene glycol ester nonionic surfactants. Examples of the fatty acid include higher fatty acids, such as lauric acid and oleic acid. Example of the polyhydric alcohol fatty acid ester in the ethylene oxide adducts thereof is a partial ester of a polyhydric alcohol (e.g., glycerol and sorbitol) and a fatty acid.

Example of the alkylamine in the alkylamine/ethylene oxide adducts is lauryl amine. Examples of the amide of fatty acid in the ethylene oxide adducts thereof is oleic amide.

Example of the polypropylene glycol in the ethylene oxide adducts thereof is a polypropylene glycole havine a molecular weight from 1,000 to 2,500. The polypropylene glycol in the ethylene oxide adduct can function as a hydrophobic group.

The polyethylene glycol derivative can be a compound having one of the formula (V-2) to (V-6):

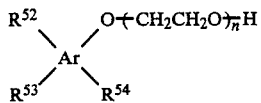

in which Ar is benzene ring or naphthalene ring; each of $R^{52}$, $R^{53}$ and $R^{54}$ individually is a monovalent substituent group of the Ar selected from the group consisting of hydrogen, a halogen atom, carboxyl, an acyl group, an alkoxycarbonyl group, an alkyl group, a substituted alkyl group, an alkoxy group and phenyl; and n is an integer of 2 to 100;

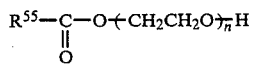

in which $R^{55}$ is an alkyl group containing 1-22 carbon atoms or a substituted alkyl group containing 1-22 carbon atoms (the substituent group preferably is a halogen atom); and n is an integer of 2 to 100;

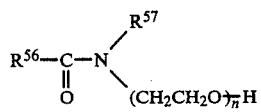

in which $R^{56}$ is an alkyl group containing 1-22 carbon atoms or a substituted alkyl group containing 1-22 carbon atoms (the substituent group preferably is a halogen atom); $R^{57}$ is a monovalent group selected from the group consisting of an alkyl group containing 1-22 carbon atoms, a substituted alkyl group containing 1-22 carbon atoms (the substituent group preferably is a halogen atom), phenyl, an alkylphenyl group and $-(CH_2CH_2O)_mH$ (m is an integer of 2 to 100); and n is an integer of 2 to 100;

in which $R^{58}$ is an alkyl group containing 1-22 carbon atoms or a substituted alkyl group containing 1-22 carbon atoms (the substitutent group preferably is a halogen atom); and n is an integer of 2 to 100;

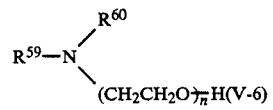

in which $R^{59}$ is an alkyl group containing 1-22 carbon atoms or a substituted alkyl group containing 1-22 carbon atoms (the substituent group preferably is a halogen atom); $R^{60}$ is a monovalent group selected from the group consisting of an alkyl group containing 1-22 carbon atoms, a substituted alkyl group containing 1-22 carbon atoms (the substituent group preferably is a halogen atom), phenyl, an alkylphenyl group and $-(CH_2CH_2O)_mH$ (m is an integer of 2 to 100); and n is an integer of 2 to 100.

Examples of the polyethylene glycol and its derivative having one of the formulas (V-1) to (V-6) are described hereinafter.

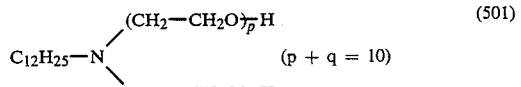 (501)

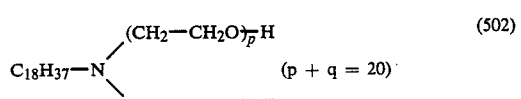 (502)

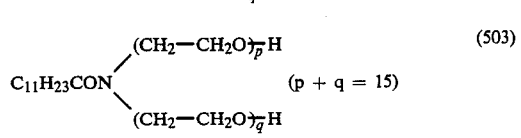 (503)

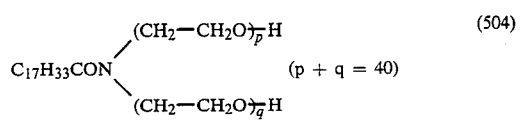 (504)

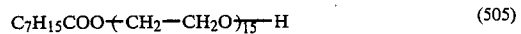 (505)

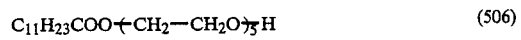 (506)

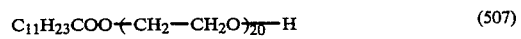 (507)

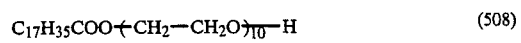 (508)

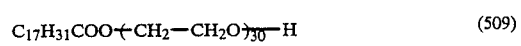 (509)

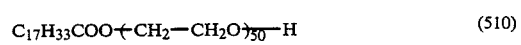 (510)

Polyoxyethylene-polyoxypropylene cetyl ether (511)

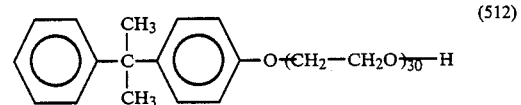 (512)

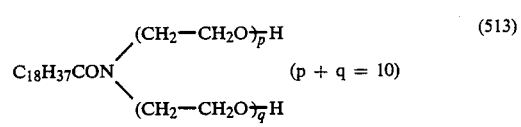 (513)

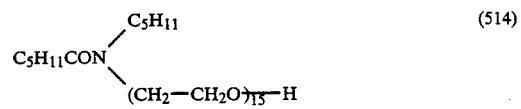 (514)

 (515)

 (516)

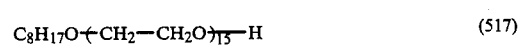 (517)

 (518)

 (519)

Polyethylene-glycerol monostearate (520)

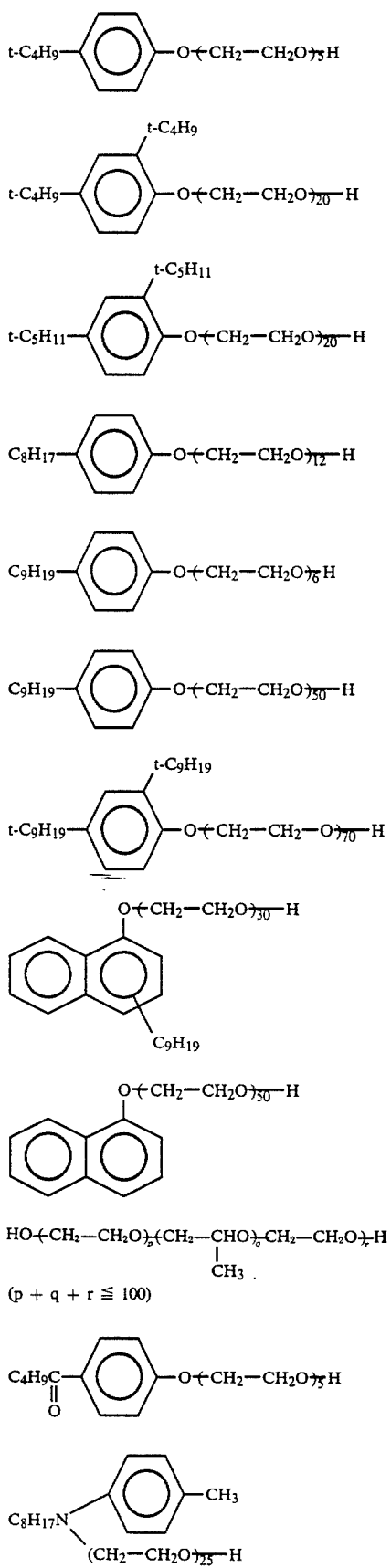

Further, the branched polyethylene oxide compounds (e.g., polypropylene oxide) can be also used.

The additive compound selected from the group consisting of a 5- or 6-membered nitrogen containing heterocyclic compound, thioura, a thiourea derivative, a thioether compound, polyethylene glycol and a polyethylene glycol derivative can be used singly or in combination of two or more compounds. A combination of a 5- or 6-membered nitrogen containing heterocyclic compound and a thioether compound is preferably used in the invention.

In the case that the 5- or 6-membered nitrogen containing heterocyclic compound (execept the cyclic amide compound) or the thiourea derivative is used as the additive compound, the amount of the additive compound in the light-sensitive layer preferably ranges from 0.0001 to 1,000 mole % based on the total silver content (contained in silver salt and an organic silver salt which is one of optional components), and more preferably ranges from 0.001 to 100 mole %.

In the case that the cyclic amide compound is used as the additive compound, the cyclic amide compound is preferably used in amount of from 0.01 to 50 weight % based on the silver content of the silver halide, and more preferably from 0.1 to 10 weight %.

In the case that the thioether compound is used as the additive compound, the amount of the thioether in the light-sensitive layer preferably ranges from 0.1 to 100 mole % based on the total silver content, more preferably ranges from 0.05 mole %, and most preferably ranges from 0.1 to 20 mole %.

In the case that the polyethylene glycol or its derivative is used as the additive compound, the polyethylene glycol derivative is preferably used in amount of from 0.001 to 50 weight % based on the amount of the polymerizable compound, and more preferably from 0.01 to 10 weight %.

The silver halide, the reducing agent, the polymerizable compound and the support which constitute the light-sensitive material of the invention are described below. Thus composed material is referred hereinafter to as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291–334 (1977), Research Disclosure No. 17029, 9–15 (June 1978), and Research Disclosure No. 17643, 22–31 (December 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl} phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compounds employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. A light-sensitive material in which the polymerizable compound is dispersed in the form of oil droplets is described in Japanese Patent Application No. 60(1985)-218603. Other components in the light-sensitive layer, such as silver halide, the reducing agent, the color image forming substances may be also contained in the oil droplets. A light-sensitive material in which silver halide is contained in the oil droplets is described in Japanese Patent Application No. 60(1985)-261888.

The oil droplets of the polymerizable compound are preferably prepared in the form of microcapsules. There is no specific limitation on preparation of the microcapsules. The light-sensitive material in which the oil droplets are present in the form of a microcapsule is described in Japanese Patent Application No. 60(1985)-117089. There is also no specific limitation on shell material of the microcapsule, and various known materials such as polymers which are employed in the conventional microcapsules can be employed as the shell material. The mean size of the microcapsule preferably ranges from 0.5 to 50 μm, more preferably 1 to 25 μm, most preferably 3 to 20 μm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminar promoted by the Society of Kinki Chemical Industry, "The Newest Chemistry of Coloring Matter—Attractive Application and New Development as a Functional Coloring Matter", 26-32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. The light-sensitive material wherein the sensitizing dye has been added during the silver halide grain formation is described in Japanese Patent Application No. 60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect. The light-sensitive material employing an organic silver salt is described in Japanese Patent Application No. 60(1985)-141799 (corresponding to U.S. Patent Ser. No. 879,747).

Various image formation accelerators are employable in the light-sensitive materials of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inoragnic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quanternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Application No. 61(1986)-243449 (corresponding to U.S. Patent Ser. No. 854,640).

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium oxide or alumina described in U.S. Pat. No. 2,711,375. Such particles preferably have a mean size of 3 to 50 μm, more preferably 5 to 50 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9-15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

The light-sensitive material employing the heating layer is described in Japanese Patent Application No. 60(1985)-135568. Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interor of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that is known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

The additive compound of the present invention can be incorporated into the polymerizable compound (including the light-sensitive composition) to prepare the light-sensitive material of the invention. The additive compound can be directly added to the polymerizable compound, or dissolved in an adequate solvent (e.g. ethyl acetate, cyclohexane, methylene chloride) prior to the addition of the polymerizable compound. In the case that the polyethylene glycol derivative is used as the additive compound, the polyethylene glycol or its derivative is preferably incorporated into the polymerizable compound to finely disperse the droplets of the polymerizable compound.

Further, the additive compound of the invention can be incorporated into an aqueous medium, such as the silver halide emulsion, the emulsion of the polymerizable compound, and the coating solution to prepare the light-sensitive material of the invention. The additive compound can be dissolved in a water-soluble organic solvent (e.g. methanol, ethanol, acetone, dimethylformamide) or a mixture of the solvent and water prior to the addition to the aqueous medium. The additive compound can be also incorporated into the aqueous medium by an emulsifying method using an organic solvent having a high boiling point as described in U.S. Pat. No. 2,322,029 or a method of dispersing fine particles as described in Japanese Patent Provisional Publication No. 59(1984)-17830.

In the case that the 5- or 6-membered nitrogen containing heterocyclic compound is used as the additive compound of the invention, the compound is preferably incorporated into the silver halide emulsion while the grain formation or the grain ripening. In the above process the silver halide grain adsorbs the heterocyclic compound, and the heterocyclic compound adsorbed to the grain excellently functions as the additive compound. Therefore, the above prepared light-sensitive material gives a clear image having very high contrast. Further the above preparation process has another advantage of excellent preservabilities of the coating solusion in the preparation and of the obtained light-sensitive material, because the heterocyclic compound is tightly adsorbed to the silver halide grain.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either a monochromatic image or a color image.

Development of the light-sensitive material can be conducted simultaneously with or after the imagewise exposure. The development can be conducted using a developing solution in the same manner as the image forming method described in Japanese Patent Publication No. 45(1970)-11149. The image forming mwethod described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Application No. 61(1986)-243449 (corresponding to U.S. Patent Ser. No. 854,640).

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849 (corresponding to U.S. Patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material to be composed of a simple support.

For example, when a color formation system using a color forming and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, pressing the light-sensitive material in contact with the image-receiving material to transfer the polymerizable compounds which is still polymerizable to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 35 g of sodium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 ml and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excess salts were sedimented and removed from the resulting emulsion by pH-adjustment. Thereafter, the emulsion was adjusted to a pH of 6.30 to obtain a silver benzotriazole emulsion. The yield of the emulsion was 400 g.

Preparation of emulsion of polymerizable compound

In 2 ml of methylene chloride were dissolved 1.8 g of trimethylolpropane triacrylate (polymerizable compound) and 1.0 g of Pargascript Red I-6-B (produced by Ciba Geigy). The resulting solution was added to 10 g of 10% aqueous solution of polyvinyl alcohol (degree of polymerization: 500) containing 0.1 g of sodium dodecylbenzenesulfonate. The mixture was stirred at 15,000 r.p.m. for 6 min. to emulsify the polymerizable compound in the aqueous medium. The mean particle size of the resulting emulsion was 0.4 μm.

Preparation of light-sensitive material

To 30 g of the emulsion of the polymerizable compound were added 6 g of the silver halide emulsion and 24 g of the silver benzotriazole emulsion. To the mixture was added 9 ml of 5% aqueous solution of Emulex NP-8 (tradename, preduced by Nippon Emulsion Co., Ltd.). The mixture was stirred for 1 min. at 40° C. To the resulting mixture were added 20 ml of 5% aqueous solution of triethanolamine, 12 ml of 5% methanol solution of the following reducing agent (I), 2 ml of 2.5% methanol solution of the following reducing agent (II) and 4 ml of an aqueous solution containing 2 mg of the following additive compound (I-a) to prepare a coating solution.

(Reducing agent (I))

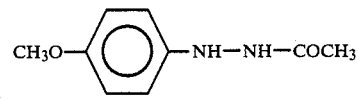

-continued (Reducing agent (II))

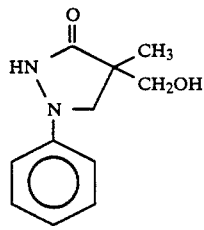

(Additive compound (I-a))

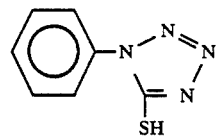

The coating solution was coated on a polyethyleneterephthalate film to give a layer having wet thickness of 50 μm and dried to obtain a light-sensitive material (I-A).

COMPARISON EXAMPLE 1

Preparation of light-sensitive material

Light-sensitive material (I-B) was prepared in the same manner as in Example 1 except that 4 ml of water was used in place of the aqueous solution containing 2 mg of the additive compound (I-a).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in a dynamic dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on an art paper having a weight of 43 g/m² to give a layer having a wet thickness of 30 μm and dried to obtain an image-receiving material.

Evaluation of light-sensitive material

Each of the light-sensitive materials prepared in Example 1 and Comparison Example 1 was imagewise exposed to light using a tungsten lamp at 200 lux for 1 second and then heated on a hot plate at 125° C. for 10 seconds. Each of the exposed and heated light-sensitive materials was then combined with the image-receiving material and passed through press rolls under pressure of 350 kg/cm² to obtain a magenta positive image on the image receiving element. The density of the obtained image was measured using Macbeth reflection densitometer. The results are set forth in Table 1.

TABLE 1

| Light-sensitive | Reflection Density | |
|---|---|---|
| Material | Maximum Density | Minimum Density |
| (I-A) | 1.50 | 0.20 |
| (I-B) | 1.55 | 0.65 |

It is apparent from the results in Table 1 that the light-sensitive material (I-A) using the additive compound of the invention forms a clear positive image which has a high maximum density and a low minimum density within the relatively short heating time (10 seconds).

EXAMPLE 2

Preparation of light-sensitive material

Light-sensitive materials (I-C) to (I-F) and (III-A) were prepared in the same manner as in Example 1 except that each of the following additive compounds (I-c) to (I-f) and (III-a) (amount is set forth in Table 2) was used in place of 2 mg of the additive compound (I-a).

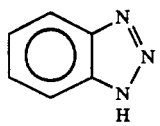

(Additive compound (I-c))

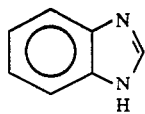

(Additive compound (I-d))

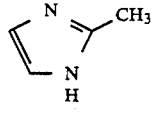

(Additive compound (I-e))

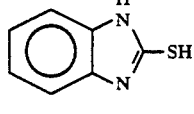

(Additive compound (I-f))

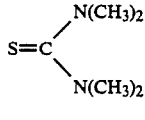

(Additive compound (III-a))

Evaluation of light-sensitive material

Each of the light-sensitive materials prepared in Example 2 was evaluated in the same manner as in Example 1 and Comparison Example 1. The results are set forth in Table 2.

TABLE 2

| Light-sensitive | Additive compound | | Reflection Density | |
|---|---|---|---|---|
| Material | Compound | Amount (mg) | Maximum Density | Minimum Density |
| (I-C) | (I-c) | 1.4 | 1.52 | 0.35 |
| (I-D) | (I-d) | 1.4 | 1.50 | 0.20 |
| (I-E) | (I-e) | 1.0 | 1.54 | 0.40 |
| (I-F) | (I-f) | 1.8 | 1.45 | 0.21 |
| (III-A) | (III-a) | 1.6 | 1.51 | 0.20 |

EXAMPLE 3

Preparation of emulsion of polymerizable compound

In 2 ml of metylene chloride were dissolved 1.8 g of trimethylolpropane triacrylate (polymerizable compound), 1.0 g of Pargascript Red I-6-B (produced by Ciba-Geigy), 0.87 g of the following reducing agent (III) and 0.76 g of the following reducing agent (IV).

(Reducing agent III)

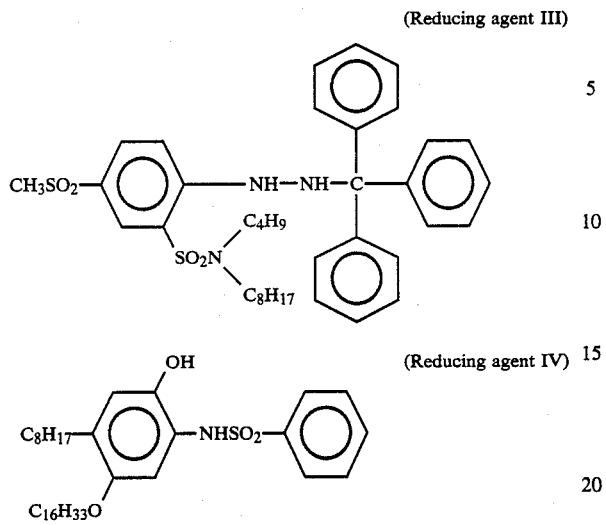

(Reducing agent IV)

The resulting solution was added to 10 g of 10% aqueous solution of polyvinyl alcohol (degree of polymerization: 500) containing 0.1 g of sodium dodecylbenzenesulfonate. The mixture was stirred at 15,000 r.p.m. for 6 min. to emulsify the polymerizable compound in the aqueous medium. The mean particle size of the resulting emulsion was 0.4 μm.

Preparation of light-sensitive material

To 30 g of the emulsion of the polymerizable compound were added 6 g the silver halide emulsion and 24 g of the silver benzotriazole emulsion. To the mixture were added 9 ml of 5% aqueous solution of Emulex NP-8 (tradename, preduced by Nippon Emulsion Co., Ltd.), 20 ml of 9% solution (solvent: water/ethanol=80/20 as volume ratio) of guanidine 4-methylsulfonylphenylsulfonylacetate and 4 ml of an aqueous solution containing 2 mg of the additive compound (I-a) used in Example 1. The mixture was stirred for 1 min. to prepare a coating solution. The coating solution was coated on a polyethyleneterephthalate film to give a layer having wet thickness of 50 μm and dried to obtain a light-sensitive material (I-H).

COMPARISON EXAMPLE 2

Preparation of light-sensitive material

Light-sensitive material (I-I) was prepared in the same manner as in Example 3 except that 4 ml of water was used in place of 4 ml of the aqueous solution containing 2 mg of the additive compound (I-a).

Evaluation of light-sensitive material

Each of the light-sensitive materials prepared in Example 3 and Comparison Example 2 was evaluated in the same manner as in Example 1 and Comparison Example 1 except that the heating time is 30 seconds. The results are set forth in Table 3.

TABLE 3

| Light-sensitive | Reflection Density | |
| Material | Maximum Density | Minimum Density |
| --- | --- | --- |
| (I-H) | 1.53 | 0.21 |
| (I-I) | 1.55 | 0.55 |

EXAMPLE 4

Preparation of light-sensitive composition

In 15 g of trimethylolpropane triacrylate were dissolved 0.06 g of the following copolymer, 1.5 g of Pargascript Red I-6-B (produced by Ciba Geigy), 1.73 g of the reducing agent (III) used in Example 3 and 1.07 g of the reducing agent (IV) used in Example 3.

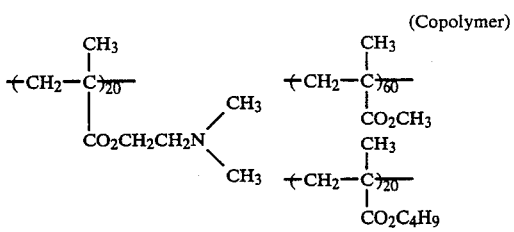

(Copolymer)

To the resulting solution were added 3.5 g of the silver halide emulsion, 3.5 g of the silver benzotriazole emulsion, 0.3 g of Emulex NP-8 (tradename, preduced by Nippon Emulsion Co., Ltd.) and 0.5 ml of an aqueous solution containing 0.5 mg of the additive compound (I-a) used in Example 1. The mixture was stirred at 15,000 r.p.m. for 5 min. using a homogenizer at 40° C. to obtain a light-sensitive composition.

Preparation of light-sensitive microcapsule

To 8.2 g of 22% aqueous solution of Isobam (tradename, produced by Kuraray Co., Ltd.) was added 39 g of 3% aqueous solution of pectin. After the solution was adjusted to a pH of 4.0 using 10% sulfuric acid, the light-sensitive composition was added to the resulting solution, and the mixture was stirred at 7,000 r.p.m. for 2 min. using a homogenizer at 40° C. to emulsify the light-sensitive composition in the aqueous medium.

To 55 g of the aqueous emulsion were added 6 g of 40% aqueous solution of urea, 2.5 g of 10% aqueous solution of resorcinol, and 8 g of 30% aqueous solution of formaldehyde in this order, and the mixture was heated at 60° C. for 2 hours while stirring at 1,000 r.p.m. to obtain a dispersion containing light-sensitive microcapsules.

Preparation of light-sensitive material

To 10.0 g of the light-sensitive microcapsule dispersion were added 0.8 g of 10% aqueous solution of triethanolamine to prepare a coating solution. The coating solution was coated on a polyethyleneterephthalate film to give a layer having wet thickness of 50 μm and dried to obtain a light-sensitive material (I-J).

COMPARISON EXAMPLE 3

Preparation of light-sensitive composition

Light-sensitive composition was prepared in the same manner as in Example 4 except that 0.5 ml of water was used in place of 0.5 ml of the aqueous solution containing 0.5 mg of the additive compound (I-a).

Preparation of light-sensitive microcapsule

Dispersion of light-sensitive microcapsule was prepared in the same manner as in Example 4 except that the above light-sensitive composition was used.

Preparation of light-sensitive material

Light-sensitive material (I-K) was prepared in the same manner as in Example 4 except that the above light-sensitive microcapsule was used.

EXAMPLE 5

Preparation of light-sensitive material

To 10.0 g of the light-sensitive microcapsule dispersion used in Example 4 were added 1 g of 20% solution (solvent: water/ethanol=50/50 as volume ratio) of guanidine trichlroloacetate to prepare a coating solution. The coating solution was coated on a polyethyleneterephthalate film to give a layer having wet thickness of 50 μm and dried to obtain a light-sensitive material (I-L).

COMPARISON EXAMPLE 4

Preparation of light-sensitive composition

Light-sensitive composition was prepared in the same manner as in Example 5 except that 0.5 ml of water was used in place of 0.5 ml of the aqueous solution containing 0.5 mg of the additive compound (I-a).

Preparation of light-sensitive microcapsule

Dispersion of light-sensitive microcapsule was prepared in the same manner as in Example 5 except that the above light-sensitive composition was used.

Preparation of light-sensitive material

Light-sensitive material (I-M) was prepared in the same manner as in Example 5 except that the above light-sensitive microcapsule was used.

Evaluation of light-sensitive material

Each of the light-sensitive materials prepared in Example 4, 5 and Comparison Example 3, 4 was evaluated in the same manner as in Example 1 and Comparison Example 1 except that the heating time is 40 seconds. The results are set forth in Table 4.

TABLE 4

| Light-sensitive | Reflection Density | |
|---|---|---|
| Material | Maximum Density | Minimum Density |
| (I-J) | 1.35 | 0.20 |
| (I-K) | 1.34 | 0.55 |
| (I-L) | 1.30 | 0.19 |
| (I-M) | 1.30 | 0.54 |

All of the light-sensitive materials form clear positive images, but it is apparent from the results in Table 4 that each of the light-sensitive materials (I-J) and (I-L) using the additive compounds of the invention forms a more clear image which has a low minimum density within the relatively short heating time (40 seconds).

EXAMPLE 6

Preparation of light-sensitive material

To 30 g of the emulsion of the polymerizable compound used in Example 1 were added 15 g of the silver halide emulsion and 15 g of the silver benzotriazole emulsion. To the mixture was added 9 ml of 5% aqueous solution of Emulex NP-8 (tradename, preduced by Nippon Emulsion Co., Ltd.). The mixture was stirred for 1 min. at 40° C. To the resulting mixture were added 20 ml of 5% aqueous solution of triethanolamine, 12 ml of 5% methanol solution of the reducing agent (I) used in Example 1, 2 ml of 2.5% methanol solution of the reducing agent (II) used in Example 1 and 4 ml of an aqueous solution containing 0.2 g of the following additive compound (II-a) to prepare a coating solution.

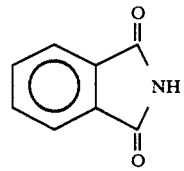

(Additive compound (II-a))

The coating solution was coated on a polyethyleneterephthalate film to give a layer having wet thickness of 50 μm and dried to obtain a light-sensitive material (II-A).

COMPARISON EXAMPLE 5

Preparation of light-sensitive material

Light-sensitive material (II-B) was prepared in the same manner as in Example 6 except that 4 ml of water was used in place of the aqueous solution containing 0.2 g of the additive compound (II-a).

Evaluation of light-sensitive material

Each of the light-sensitive materials prepared in Example 6 and Comparison Example 5 was evaluated in the same manner as in Example 1 and Comparison Example 1. The results are set forth in Table 5.

TABLE 5

| Light-sensitive | Reflection Density | |
|---|---|---|
| Material | Maximum Density | Minimum Density |
| (II-A) | 1.50 | 0.22 |
| (II-B) | 1.55 | 0.55 |

It is apparent from the results in Table 5 that the light-sensitive material (II-A) using the additive compound of the invention forms a clear positive image which has a high maximum density and a low minimum density within the relatively short heating time (10 seconds).

EXAMPLE 7

Preparation of light-sensitive material

Light-sensitive materials (II-C) to (II-G) were prepared in the same manner as in Example 6 except that each of the following additive compounds (II-c) to (II-g) (amount is set forth in Table 6) was used in place of 0.2 g of the additive compound (II-a).

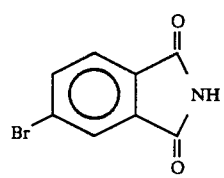

(Additive compound (II-c))

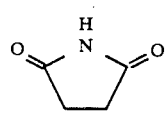

(Additive compound (II-d))

-continued (Additive compound (II-e))

(C₂H₅)₂N—SO₂—[benzene ring with two C=O groups and NH, forming phthalimide-type structure]

(Additive compound II-f))

[benzene ring fused with ring containing CH=N–NH–C(=O)]

(Additive compound (II-g))

[benzene ring fused with ring containing CH=NH and CH=O with NH]

Evaluation of light-sensitive material

Each of the light-sensitive materials prepared in Example 7 was evaluated in the same manner as in Example 1 and Comparison Example 1. The results are set forth in Table 6.

TABLE 6

| Light-sensitive Material | Additive compound Compound | Additive compound Amount (g) | Reflection Density Maximum Density | Reflection Density Minimum Density |
|---|---|---|---|---|
| (II-C) | (II-c) | 0.2 | 1.52 | 0.23 |
| (II-D) | (II-d) | 0.2 | 1.49 | 0.20 |
| (II-E) | (II-e) | 0.3 | 1.52 | 0.22 |
| (II-F) | (II-f) | 0.2 | 1.50 | 0.21 |
| (II-G) | (II-g) | 0.2 | 1.50 | 0.30 |

EXAMPLE 8

Preparation of light-sensitive material

To 30 g of the emulsion of the polymerizable compound used in Example 3 were added 15 g of the silver halide emulsion and 15 g of the silver benzotriazole emulsion. To the mixture were added 9 ml of 5% aqueous solution of Emulex NP-8 (tradename, produced by Nippon Emulsion Co., Ltd.), 20 ml of 9% solution (solvent: water/ethanol=80/20 as volume ratio) of guanidine 4-methylsulfonylphenylsulfonylacetate and 4 ml of an aqueous solution containing 0.2 g of the additive compound (II-a) used in Example 6. The mixture was stirred for 1 min. to prepare a coating solution. The coating solution was coated on a polyethyleneterephthalate film to give a layer having wet thickness of 50 μm and dried to obtain a light-sensitive material (II-H).

COMPARISON EXAMPLE 6

Preparation of light-sensitive material

Light-sensitive material (II-I) was prepared in the same manner as in Example 8 except that 4 ml of water was used in place of 4 ml of the aqueous solution containing 0.2 g of the additive compound (II-a).

Evaluation of light-sensitive material

Each of the light-sensitive materials prepared in Example 8 and Comparison Example 6 was evaluated in the same manner as in Example 1 and Comparison Example 1 except that the heating time is 30 seconds. The results are set forth in Table 7.

TABLE 7

| Light-sensitive Material | Reflection Density Maximum Density | Reflection Density Minimum Density |
|---|---|---|
| (II-H) | 1.50 | 0.20 |
| (II-I) | 1.55 | 0.55 |

EXAMPLE 9

Preparation of light-sensitive composition

Light-sensitive composition was prepared in the same manner as in Example 4 except that 0.5 ml of an aqueous solution containing 0.5 mg of the additive compound (II-c) used in Example 7 was used in place of 0.5 ml of the aqueous solution containing 0.5 mg of the additive compound (I-a).

Preparation of light-sensitive microcapsule

Dispersion of light-sensitive microcapsule was prepared in the same manner as in Example 4 except that the above light-sensitive composition was used.

Preparation of light-sensitive material

Light-sensitive material (II-J) was prepared in the same manner as in Example 4 except that the above light-sensitive microcapsule was used.

COMPARISON EXAMPLE 7

Preparation of light-sensitive composition

Light-sensitive composition was prepared in the same manner as in Example 9 except that 0.5 ml of water was used in place of 0.5 ml of the aqueous solution containing 0.5 mg of the additive compound (II-c).

Preparation of light-sensitive microcapsule

Dispersion of light-sensitive microcapsule was prepared in the same manner as in Example 9 except that the above light-sensitive composition was used.

Preparation of light-sensitive material

Light-sensitive material (II-K) was prepared in the same manner as in Example 9 except that the above light-sensitive microcapsule was used.

EXAMPLE 10

Preparation of light-sensitive material

To 10.0 g of the light-sensitive microcapsule dispersion used in Example 9 were added 1 g of 20% solution (solvent: water/ethanol=50/50 as volume ratio) of guanidine trichroloacetate to prepare a coating solution. The coating solution was coated on a polyethyleneterephthalate film to give a layer having wet thickness of 50 μm and dried to obtain a light-sensitive material (II-L).

COMPARISON EXAMPLE 8

Preparation of light-sensitive composition

Light-sensitive composition was prepared in the same manner as in Example 10 except that 0.5 ml of water was used in place of 0.5 ml of the aqueous solution containing 0.5 mg of the additive compound (II-c).

Preparation of light-sensitive microcapsule

Dispersion of light-sensitive microcapsule was prepared in the same manner as in Example 10 except that the above light-sensitive composition was used.

Preparation of light-sensitive material

Light-sensitive material (II-M) was prepared in the same manner as in Example 10 except that the above light-sensitive microcapsule was used.

Evaluation of light-sensitive material

Each of the light-sensitive materials prepared in Examples 9 & 10 and Comparison Examples 7 & 8 was evaluated in the same manner as in Example 1 and Comparison Example 1 except that the heating time was changed to 40 seconds. The results are set forth in Table 8.

TABLE 8

| Light-sensitive | Reflection Density | |
|---|---|---|
| Material | Maximum Density | Minimum Density |
| (II-J) | 1.35 | 0.21 |
| (II-K) | 1.34 | 0.55 |
| (II-L) | 1.22 | 0.19 |
| (II-M) | 1.30 | 0.54 |

All of the light-sensitive materials form clear positive images, but it is apparent from the results in Table 8 that each of the light-sensitive materials (II-J) and (II-L) using the additive compounds of the invention forms a more clear image which has a low minimum density within the relatively short heating time (40 seconds).

EXAMPLE 11

Preparation of light-sensitive material

Light-sensitive material (IV-A) was prepared in the same manner as in Example 6 except that 4 ml of an aqueous solution containing 2 mg of the following additive compound (IV-a) in place of 4 ml of the aqueous solution containing 0.2 g of the additive compound (II-a).

(Additive compound (IV-a))

HO—CH$_2$—CH$_2$—S—CH$_2$—CH$_2$—S—CH$_2$—CH$_2$—OH

COMPARISON EXAMPLE 9

Preparation of light-sensitive material

Light-sensitive material (IV-B) was prepared in the same manner as in Example 11 except that 4 ml of water was used in place of the aqueous solution containing 2 mg of the additive compound (IV-a).

Evaluation of light-sensitive material

Each of the light-sensitive materials prepared in Example 11 and Comparison Example 9 was evaluated in the same manner as in Example 1 and Comparison Example 1. The results are set forth in Table 9.

TABLE 9

| Light-sensitive | Reflection Density | |
|---|---|---|
| Material | Maximum Density | Minimum Density |
| (IV-A) | 1.54 | 0.25 |

TABLE 9-continued

| Light-sensitive | Reflection Density | |
|---|---|---|
| Material | Maximum Density | Minimum Density |
| (IV-B) | 1.55 | 0.65 |

It is apparent from the results in Table 9 that the light-sensitive material (IV-A) using the additive compound of the invention forms a clear positive image which has a high maximum density and a low minimum density within the relatively short heating time (10 seconds).

EXAMPLE 12

Preparation of light-sensitive material

Light-sensitive materials (IV-C) to (IV-G) were prepared in the same manner as in Example 11 except that each of the following additive compounds (II-c) to (II-g) (amount is set forth in Table 10) was used in place of 2 mg of the additive compound (IV-a).

(Additive compound (IV-c))

HO—CH$_2$—CH$_2$—CH$_2$—S—CH$_2$—CH$_2$—S—CH$_2$—CH$_2$—CH$_2$—OH (Additive compound (IV-d))

H$_2$NCO—CH$_2$—CH$_2$—CH$_2$—S—CH$_2$—CH$_2$—S—CH$_2$—CH$_2$—CONH$_2$ (Additive compound (IV-e))

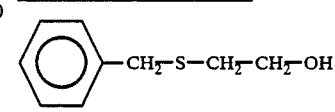

(Additive compound (IV-f))

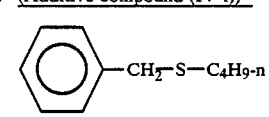

(Additive compound (IV-g))

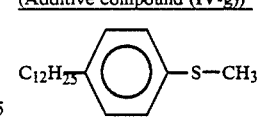

Evaluation of light-sensitive material

Each of the light-sensitive materials prepared in Example 12 was evaluated in the same manner as in Example 1 and Comparison Example 1. The results are set forth in Table 10.

TABLE 10

| Light-sensitive | Additive Compound | | Reflection Density | |
|---|---|---|---|---|
| Material | Compound | Amount (mg) | Maximum Density | Minimum Density |
| (IV-C) | (IV-c) | 110 | 1.54 | 0.23 |
| (IV-D) | (IV-d) | 40 | 1.45 | 0.20 |
| (IV-E) | (IV-e) | 45 | 1.55 | 0.26 |
| (IV-F) | (IV-f) | 25 | 1.55 | 0.30 |
| (IV-G) | (IV-g) | 40 | 1.54 | 0.32 |

EXAMPLE 13

Preparation of light-sensitive material

Light-sensitive material (IV-H) was prepared in the same manner as in Example 3 except that 4 ml of an aqueous solution containing 100 mg of the additive compound (IV-a) used in Example 11 was used in place of 4 ml of the aqueous solution containing 2 mg of the additive compound (I-a).

COMPARISON EXAMPLE 10

Preparation of light-sensitive material

Light-sensitive material (IV-I) was prepared in the same manner as in Example 10 except that 4 ml of water was used in place of the aqueous solution containing 100 mg of the additive compound (IV-a).

Evaluation of light-sensitive material

Each of the light-sensitive materials prepared in Example 13 and Comparison Example 10 was evaluated in the same manner as in Example 1 and Comparison Example 1 except that the heating time was changed to 30 seconds. The results are set forth in Table 11.

TABLE 11

| Light-sensitive | Reflection Density | |
| Material | Maximum Density | Minimum Density |
| --- | --- | --- |
| (IV-H) | 1.53 | 0.23 |
| (IV-I) | 1.55 | 0.55 |

EXAMPLE 14

Preparation of light-sensitive composition

Light-sensitive composition was prepared in the same manner as in Example 4 except that 0.5 ml of an aqueous solution containing 25 mg of the additive compound (IV-a) used in Example 11 was used in place of 0.5 ml of the aqueous solution containing 0.5 mg of the additive compound (I-a).

Preparation of light-sensitive microcapsule

Dispersion of light-sensitive microcapsule was prepared in the same manner as in Example 4 except that the above light-sensitive composition was used.

Preparation of light-sensitive material

Light-sensitive material (IV-J) was prepared in the same manner as in Example 4 except that the above light-sensitive microcapsule was used.

COMPARISON EXAMPLE 11

Preparation of light-sensitive composition

Light-sensitive composition was prepared in the same manner as in Example 14 except that 0.5 ml of water was used in place of 0.5 ml of the aqueous solution containing 25 mg of the additive compound (IV-a).

Preparation of light-sensitive microcapsule

Dispersion of light-sensitive microcapsule was prepared in the same manner as in Example 14 except that the above light-sensitive composition was used.

Preparation of light-sensitive material

Light-sensitive material (IV-K) was prepared in the same manner as in Example 14 except that the above light-sensitive microcapsule was used.

EXAMPLE 15

Preparation of light-sensitive material

To 10.0 g of the light-sensitive microcapsule dispersion used in Example 14 were added 1 g of 20% solution (solvent: water/ethanol=50/50 as volume ratio) of guanidine trichroloacetate to prepare a coating solution. The coating solution was coated on a polyethyleneterephthalate film to give a layer having wet thickness of 50 μm and dried to obtain a light-sensitive material (IV-L).

COMPARISON EXAMPLE 12

Preparation of light-sensitive composition

Light-sensitive composition was prepared in the same manner as in Example 15 except that 0.5 ml of water was used in place of 0.5 ml of the aqueous solution containing 25 mg of the additive compound (IV-a).

Preparation of light-sensitive microcapsule

Dispersion of light-sensitive microcapsule was prepared in the same manner as in Example 15 except that the above light-sensitive composition was used.

Preparation of light-sensitive material

Light-sensitive material (IV-M) was prepared in the same manner as in Example 15 except that the above light-sensitive microcapsule was used.

Evaluation of light-sensitive material

Each of the light-sensitive materials prepared in Examples 14 & 15 and Comparison Examples 11 & 12 was evaluated in the same manner as in Example 1 and Comparison Example 1 except that the heating time is 40 seconds. The results are set forth in Table 12.

TABLE 12

| Light-sensitive | Reflection Density | |
| Material | Maximum Density | Minimum Density |
| --- | --- | --- |
| (IV-J) | 1.33 | 0.23 |
| (IV-K) | 1.34 | 0.55 |
| (IV-L) | 1.30 | 0.21 |
| (IV-M) | 1.30 | 0.54 |

All of the light-sensitive materials form clear positive images, but it is apparent from the results in Table 12 that each of the light-sensitive materials (IV-J) and (IV-L) using the additive compounds of the invention forms a more clear image which has a low minimum density within the relatively short heating time (40 seconds).

EXAMPLE 16

Preparation of light-sensitive composition

In 100 g of trimethylolpropane triacrylate were dissolved 0.40 g of the copolymer used in Example 4 and 6.00 g of Pargascript Red I-6-B (produced by Ciba Geigy). In 18.00 g of the resulting solution was dissolved 0.36 g of the following additive compound (V-a).

(Additive compound (V-a))

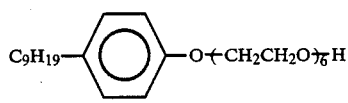

To the resulting solution was added a solution in which 0.16 g of the following reducing agent (V) and 1.22 g of the reducing agent (IV) used in Example 3 are dissolved in 1.80 g of methylene chloride.

(Reducing agent V)

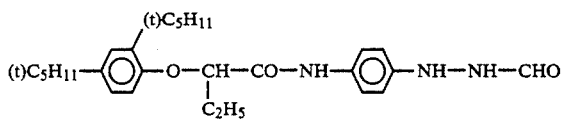

Further, to the resulting solution were added 3.50 g of the silver halide emulsion and 3.35 g of the silver benzotriazole emulsion, and the mixture was stirred at 15,000 r.p.m. for 5 min. using a homogenizer to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium.

To the aqueous emulsion were added 72.5 g of 40% aqueous solution of urea, 2.82 g of 11.3% aqueous solution of resorcinol, 8.56 g of 37% aqueous solution of formaldehyde, and 2.74 g of an 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

(Anionic surfactant)

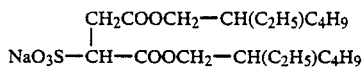

The coating solution was uniformly coated on a polyethyleneterephthalate film (thickness: 100 μm) using a coating rod of #40 to give a layer having wet thickness of 70 μm and dried at about 40° C. to obtain a light-sensitive material (V-A).

EXAMPLE 17

Preparation of light-sensitive composition

Light-sensitive compositions were prepared in the same manner as in Example 16 except that each 0.36 g of the following additive compounds (V-b) to (V-d) and polyethylene glycol (additive compound (V-e); the average molecular weight is 1,000) was used in place of 0.36 g of the additive compound (V-a).

(Additive compound (V-b))

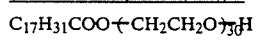

(Additive compound (V-c))

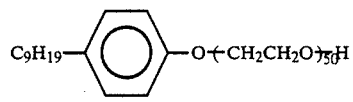

(Additive compound (V-d))

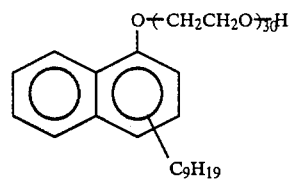

Preparation of light-sensitive microcapsule

Dispersions of light-sensitive microcapsule were prepared in the same manner as in Example 16 except that the above light-sensitive compositions were used.

Preparation of light-sensitive material

Light-sensitive materials (V-B) to (V-E) were prepared in the same manner as in Example 16 except that the above light-sensitive microcapsules were used.

COMPARISON EXAMPLE 13

Preparation of light-sensitive composition

Light-sensitive composition was prepared in the same manner as in Example 16 except that no additive compound was used.

Preparation of light-sensitive microcapsule

Dispersion of light-sensitive microcapsule was prepared in the same manner as in Example 16 except that the above light-sensitive composition was used.

Preparation of light-sensitive material

Light-sensitive material (V-F) was prepared in the same manner as in Example 16 except that the above light-sensitive microcapsule was used.

Evaluation of light-sensitive material

Each of the light-sensitive materials prepared in Examples 16 & 17 and Comparison Example 13 was evaluated in the same manner as in Example 1 and Comparison Example 1 except that the heating time was changed to 20 seconds. The results are set forth in Table 13.

TABLE 13

| Light-sensitive Material | Additive compound | Reflection Density Maximum Density | Reflection Density Minimum Density |
|---|---|---|---|
| (V-A) | (V-a) | 1.20 | 0.15 |
| (V-B) | (V-b) | 1.18 | 0.21 |
| (V-C) | (V-c) | 1.22 | 0.13 |
| (V-D) | (V-d) | 1.20 | 0.24 |
| (V-E) | (V-e) | 1.20 | 0.20 |
| (V-F) | — | 1.22 | 0.65 |

It is apparent from the results in Table 13 that each of the light-sensitive materials (V-A) to (V-E) using the additive compound of the invention forms an improved positive image which has a low minimum density and a high contrast. Further, magenta spots within a minimum density portion (i.e., a white area) on the images obtained by the materials (V-A) to (V-E) were much more decreased, compared with the image obtained by the material (V-F).

EXAMPLE 18

Preparation of silver halide emulsion

In 3 l of water were dissolved 40 g of gelatin and 23.8 g of ptassium bromide and the resulting gelatin solution was kept at 50° C. To the gelatine solution, 200 ml of an aqueous solution containing 34 g of silver nitrate was added over a perod of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 ml.

Preparation of light-sensitive composition

In 100 g of trimethylolpropane triacrylate were dissolved 0.40 g of the copolymer used in Example 4 and 6.00 g of Pargascript Red I-6-B (produced by Chiba-Geigy). In the solution was dissolved 0.002 g of the additive compound (V-a) used in Example 16. To the resulting solution was added a solution in which 0.16 g of the reducing agent (V) used in Example 16 and 1.22 g of the reducing agent (IV) used in Example 3 are dissolved in 1.80 g of methylene chloride. Further, to the resulting solution was added a mixture which is prepared by mixing 4.06 g of the above silver halide emulsion and 0.6 ml of a 0.04% methanol solution of following dye and stirred for 5 minutes, and the resulting mixture was stirred at 15,000 r.p.m. for 5 min. to obtain a light-sensitive composition.

(Dye)

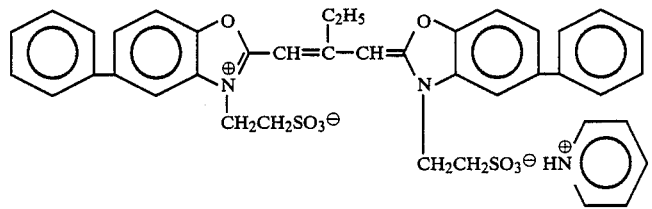

Preparation of light-sensitive microcapsule

Dispersion of light-sensitive microcapsule was prepared in the same manner as in Example 16 except that the above light-sensitive composition was used.

Preparation of light-sensitive material

Light-sensitive material (V-G) was prepared in the same manner as in Example 16 except that the above light-sensitive microcapsule was used.

EXAMPLE 19

Preparation of light-sensitive composition

Light-sensitive compositions were prepared in the same manner as in Example 3 except that each 0.36 g of the additive compounds (V-b) to (V-d) used in Example 2 and the following additive compound (V-k) was used n place of 0.36 g of the additive compound (V-a).

(Additive compound (V-k))

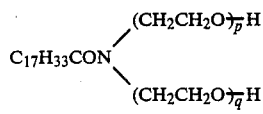

(p + q = 40)

Preparation of light-sensitive microcapsule

Dispersions of light-sensitive microcapsule were prepared in the same manner as in Example 16 except that the above light-sensitive compositions were used.

Preparation of light-sensitive material

Light-sensitive materials (V-H) to (V-K) were prepared in the same manner as in Example 16 except that the above light-sensitive microcapsules were used.

COMPARISON EXAMPLE 14

Preparation of light-sensitive composition

Light-sensitive composition was prepared in the same manner as in Example 18 except that no additive compound was used.

Preparation of light-sensitive microcapsule

Dispersion of light-sensitive microcapsule was prepared in the same manner as in Example 16 except that the above light-sensitive composition was used.

Preparation of light-sensitive material

Light-sensitive material (V-L) was prepared in the same manner as in Example 16 except that the above light-sensitive microcapsule was used.

Evaluation of light-sensitive material

Each of the light-sensitive materials prepared in Examples 18 & 19 and Comparison Example 14 was imagewise exposed to light through a green filter which transmits a light having a wavelength from 500 to 600 nm and in which the density continuously changed, using a tungsten lamp at 2,000 lux for 1 second and then heated on a hot plate at 125° C. for 40 seconds. Each of the exposed and heated light-sensitive materials was then combined with the image-receiving material and passed through press rolls under pressure of 350 kg/cm$^2$ to obtain a magenta positive image on the image receiving element. The optical density of the obtained image was measured using Macbeth reflection densitometer. The results are set forth in Table 14.

TABLE 14

| Light-sensitive Material | Additive compound | Reflection Density Maximum Density | Minimum Density |
| --- | --- | --- | --- |
| (V-G) | (V-a) | 1.18 | 0.14 |
| (V-H) | (V-b) | 1.17 | 0.20 |
| (V-I) | (V-c) | 1.20 | 0.12 |
| (V-J) | (V-d) | 1.19 | 0.25 |
| (V-K) | (V-k) | 1.18 | 0.22 |
| (V-L) | — | 1.22 | 0.75 |

It is apparent from the results in Table 14 that the additive compound of the invention in the light-sensitive material is effective when it is used in a system employing the color sensitized silver halide emulsion without an organic silver salt, because each of the light-sensitive materials (V-G) to (V-K) forms an improved positive image which has a low minimum density and a high contrast. Further, magenta spots within a minimum density portion (i.e., white area) on the images obtained by the materials (V-G) to (V-K) were much more decreased, compared with the image obtained by the material (V-L).

EXAMPLE 20

Preparation of silver halide emulsion containing 2-mercaptobenzimidazole

In 1,000 ml of water were dissolved 20 g of gelatin and 3 g of sodium chloride, and the resulting gelatin solution was kept at 75° C. To the gelatin solution, 600 ml of an aqueous solution (A) containing 21 g of sodium chloride and 35 g of sodium bromide and 600 ml of an aqueous solution (B) containing 100 g of silver nitrate were added simultaneously at the same feed rate over a period of 40 minutes. Further, to the gelatin solution, 150 ml of methanol solution containing 1.3 g of 2-mercaptobenzimidazole was added at the same feed rate over a period of 40 minutes which was started at 10 minutes after the time when the additions of the above solutions (A) and (B) were started. After the emulsion was washed for desalting and then adjusted to a pH of 6.4. The yield of the emulsion was 600 g.

Preparation of emulsion of polymerizable compound

To 28 g of mixture of trimethylolpropane triacrylate and methylmethacrylate was added a solution in which 1 g of Pargascript Red I-6-B (produced by Ciba-Geigy) is dissolved in 6 g of methylene chloride. The resulting mixture was added to 60 g of 10% aqueous solution of polyvinyl alcohol containing 0.5 g of sodium dodecylbenzenesulfonate. The mixture was stirred at 18,000 r.p.m. for 5 min. to emulsify the polymerizable compound in the aqueous medium. The mean particle size of the resulting emulsion was 0.5 μm.

Preparation of light-sensitive material

To 5 g of the emulsion of the polymerizable compound were added 3.7 g of the silver halide emulsion containing 2-mercaptobenzimidazole, 4 g of the silver benzotriazole emulsion used in Example 1, 2 g of 10% aqueous solution of polyvinyl alcohol and 0.5 g of starch. To the mixture was added a solution in which 0.02 g of p-aminophenol and β-acetylphenylhydrazine are dissolved in 1 ml of methanol to prepare a coating solution. The coating solution was coated on a polyethyleneterephthalate film to give a layer having a wet thickness of 20 μm and dried to obtain a light-sensitive material (I-N).

EXAMPLE 21

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 35 g of sodium bromide and 600 ml of an aqueous solution containing 0.59 mole of silver nitrate were added simultaneously at the same feed rate over a period of 40 minutes. The emulsion was washed for desalting and then adjusted to a pH of 6.4 to obtain a silver chlorobromide emulsion having cubic grains, uniform grain size distribution, a mean grain size of 0.35 ml and a bromide content of 80 mole %. The yield of the emulsion was 600 g.

Preparation of light-sensitive material

Light-sensitive material (I-O) was prepared in the same manner as in Example 20 except that 3.7 g of the above silver halide emulsion was used in place of 3.7 g of the silver halide emulsion containing 2-mercaptobenzimidazole and that to the coating solution was further added a solution in which 0.01 g of 2-mercaptobenzimidazole is dissolved in 1 ml of methanol.

COMPARISON EXAMPLE 15

Preparation of light-sensitive material

Light-sensitive material (I-P) was prepared in the same manner as in Example 20 except that 3.7 g of the silver halide emulsion used in Example 21 was used in place of 3.7 g of the silver halide emulsion containing 2-mercaptobenzimidazole.

Evaluation of light-sensitive material

Each of the light-sensitive materials prepared in Example 20, 21 and Comparison Example 15 was imagewise exposed and then heated on a hot plate at 125° C. for 40 seconds. Each of the exposed and heated light-sensitive materials was then combined with the image-receiving material and passed through press rolls under pressure of 200 kg/cm² to obtain a magenta positive image on the image receiving element. The optical density of the obtained image was measured using Macbeth reflection densitometer (RD519). The results are set forth in Table 15.

TABLE 15

| Light-sensitive Material | Reflection Density Maximum Density | Minimum Density |
| --- | --- | --- |
| (I-N) | 1.26 | 0.32 |
| (I-O) | 1.26 | 0.38 |
| (I-P) | 1.26 | 0.52 |

It is apparent from the results in Table 15 that each of the light-sensitive materials (I-N) and (I-O) using the additive compound of the invention forms a clear positive image which has a low minimum density.

I claim:

1. A light-sensitive material comprising a light-sensitive layer provided on a support wherein the light-sensitive layer contains silver halide, a reducing agent, an ethylenically unsaturated polymerizable compound, and an additive compound selected from the group consisting of a 5- or 6-membered nitrogen-containing heterocyclic compound, thiourea, a thiourea derivative, a thioether compound, polyethylene glycol and a polyethylene glycol derivative, wherein the silver halide, the polymerizable compound and the additive compound are present in the microcapsules which comprise a shell and a core and which are dispersed in the light-sensitive layer, the silver halide being in the shell of the microcapsules and the polymerizable compound and the additive compound being in the core of the microcapsules, and said polymerizable compound being present in an amount of 5 to $1.2 \times 10^5$ times by weight as much as the amount of the silver halide.

2. The light-sensitive material as claimed in claim 1, wherein the additive compound is a 5- or 6-membered nitrogen-containing heterocyclic compound.

3. The light-sensitive material as claimed in claim 2, wherein the 5- or 6-membered nitrogen-containing heterocyclic compound is a compound selected from the group consisting of thiazole, diazole, triazol, tetrazole and their derivatives, which may be condensed with benzene ring or naphthalene ring.

4. The light-sensitive material as claimed in claim 3, wherein the 5- or 6-membered nitrogen containing heterocyclic compound is contained in an amount of from 0.0001 to 1,000 mole % based on the total silver content in the light-sensitive layer.

5. The light-sensitive material as claimed in claim 2, wherein the 5- or 6-membered nitrogen containing heterocyclic compound is a cyclic amide compound having the formula (II-1):

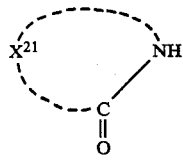

(II-1)

in which $X^{21}$ is a group which forms a 5- or 6-membered nitrogen-containing hetero ring together with —NH—CO—.

6. The light-sensitive material as claimed in claim 5, wherein the cyclic amide compound is contained in an amount of from 0.01 to 50 weight % based on the silver content of the silver halide in the light-sensitive layer.

7. The light-sensitive material as claimed in claim 1, wherein the additive compound is thiourea or a thiourea derivative having the formula (III):

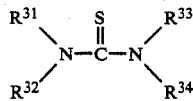

(III)

in which each of $R^{31}$, $R^{32}$, $R^{33}$ and $R^{34}$ individually is a monovalent group selected from the group consisting of hydrogen, an alkyl group, an aralkyl group an alkenyl group, an alkynyl group and an aryl group.

8. The light-sensitive material as claimed in claim 7, wherein the thiourea or its derivative is contained in an amount of from 0.0001 to 1,000 mole % based on the total silver content in the light-sensitive layer.

9. The light-sensitive material as claimed in claim 1, wherein the additive compound is a thioether compound having the formula (IV-1):

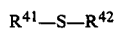

(IV-1)

in which each of $R^{41}$ and $R^{42}$ individually is a monovalent group selected from the group consisting of an aliphatic group, an aromatic group and a heterocylic group, which may have at least one substituent group.

10. The light-sensitive material as claimed in claim 9, wherein the thioether compound is contained in an amount of from 0.01 to 100 mole % based on the total silver content in the light-sensitive layer.

11. The light-sensitive material as claimed in claim 1, wherein the additive compound is polyethylene glycol or its derivative having the formula (V-1):

(V-1)

in which $R^{51}$ is a monovalent group selected from the group consisting of hydroxyl, an alkoxyl group, a polyalkoxyl group in which each alkoxyl group contains 3 or more carbon atoms, an aryloxy group, amino, an acylamino group and acyloxy group, which may have at least one substituent group; and n is an integer of 2 to 100.

12. The light-sensitive material as claimed in claim 11, wherein the polyethylene glycol or its derivative is contained in an amount of from 0.01 to 50 weight % based on the amount of the polymerizable compound in the light-sensitive layer.

13. The light-sensitive material as claimed in claim 1, wherein the light-sensitive layer further contains a color image forming substance.

14. The light-sensitive material as claimed in claim 1, wherein the additive compound is dissolved or dispersed in the polymerixable compound.

15. The light-sensitive material as claimed in claim 1, wherein the reducing agent comprises a combination of a hydrazine derivative and another reducing agent.

16. A image-forming method which comprises:
imagewise exposing a light-sensitive material comprising a light-sensitive layer provided on a support wherein the light-sensitive layer contains silver halide, a reducing agent, a polymerizable compound, and an additive compound selected from the group consisting of a 5- or 6-membered nitrogen containing heterocyclic compound, thiourea, a thiourea derivative, a thioether compound, polyethylene glycol and a polyethylene glycol derivative; and
simultaneously or thereafter heating the light-sensitive material to polymerize the polymerizable compound within the area where the latent image of the silver halide has been formed.

17. The image-forming method as claimed in claim 16, wherein after heating the light-sensitive material, the light-sensitive material is pressed on an image-receiving material to transfer the obtained image to the image-receiving material.

18. A image-forming method which comprises:
imagewise exposing a light-sensitive material comprising a light-sensitive layer provided on a support wherein the light-sensitive layer contains silver halide, a reducing agent, a polymerizable compound, and an additive compound selected from the group consisting of a 5- or 6-membered nitrogen containing heterocyclic compound, thiourea, a thiourea derivative, a thioether compound, polyethylene glycol and a polyethylene glycol derivative; and simultaneously or thereafter heating the light-sensitive material to polymerize the polymerizable compound within the area where the latent image of the silver halide has not been formed.

19. The image-forming method as claimed in claim 17, wherein after heating the light-sensitive material, the light-sensitive material is pressed on an image-receiving material to transfer the obtained image to the image-receiving material.

* * * * * ic
UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

At Column 12, line 60, after Compound (79), please insert Compounds (80) - (152) as follows:

--

(80)

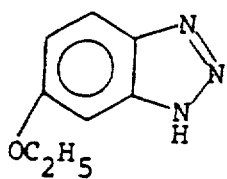

(81)

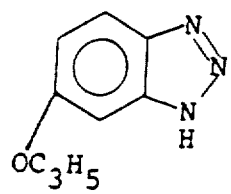

(82)

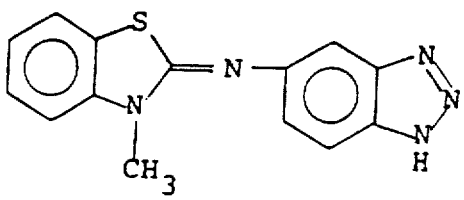

(83)

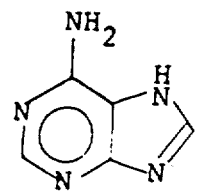

(84)

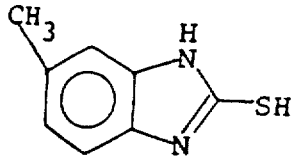

(85)

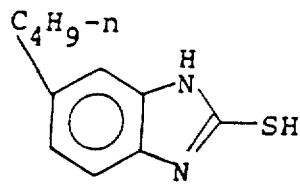

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(86)

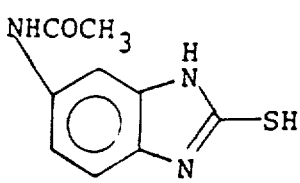

(87)

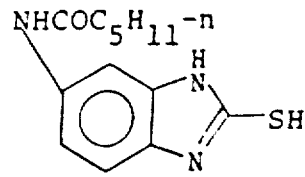

(88)

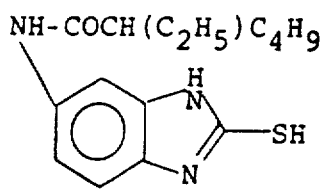

(89)

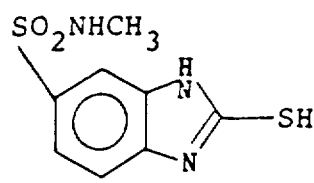

(90)

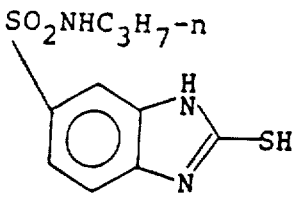

(91)

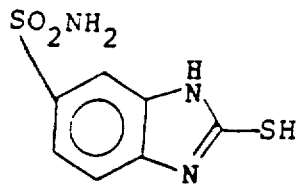

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(92)
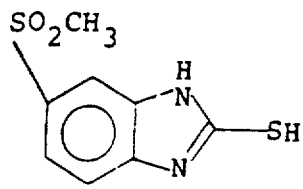

(93)
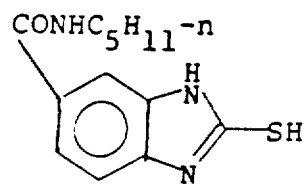

(94)
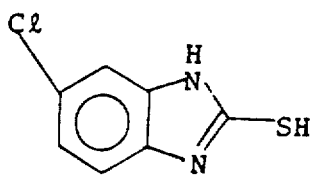

(95)
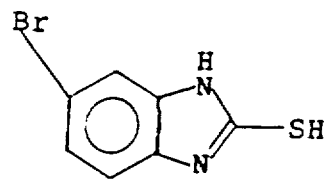

(96)
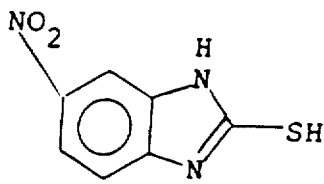

(97)
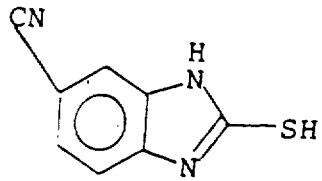

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(98)

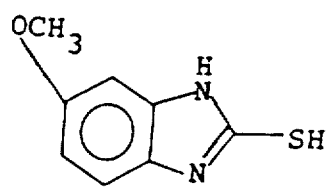

(99)

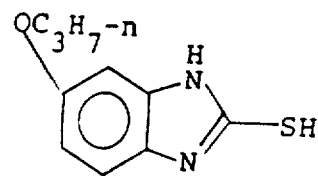

(100)

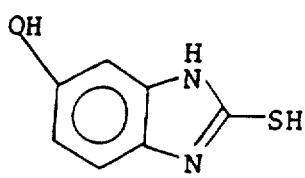

(101)

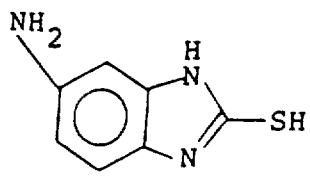

(102)

(103)

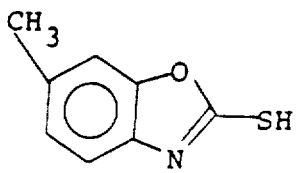

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(104)

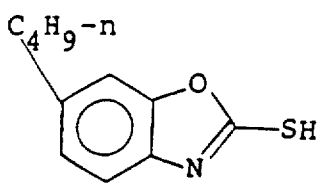

(105)

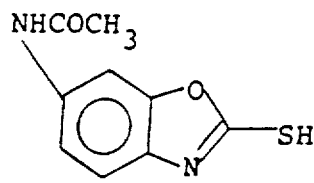

(106)

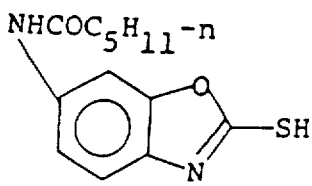

(107)

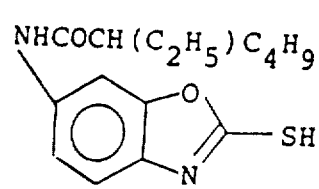

(108)

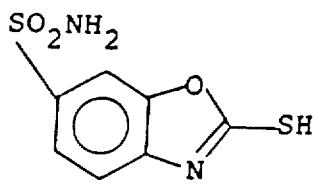

(109)

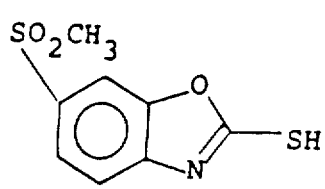

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(110)

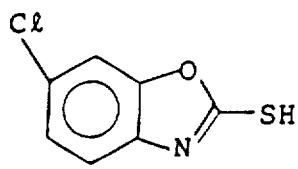

(111)

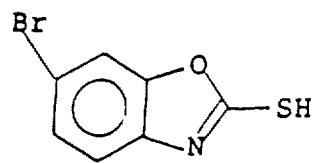

(112)

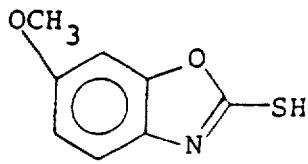

(113)

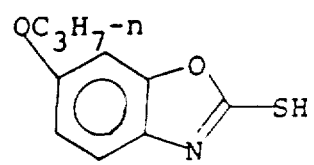

(114)

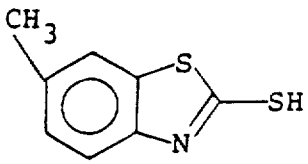

(115)

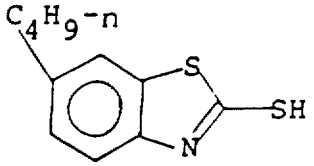

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(116)

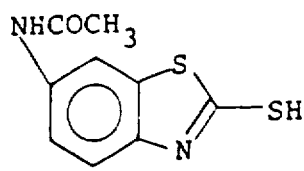

(117)

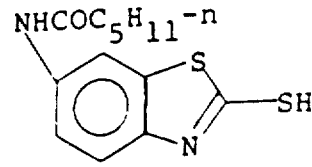

(118)

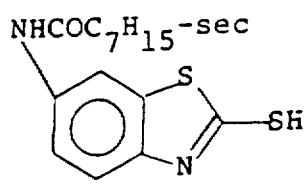

(119)

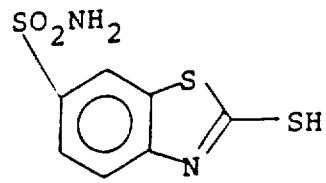

(120)

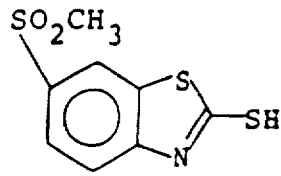

(121)

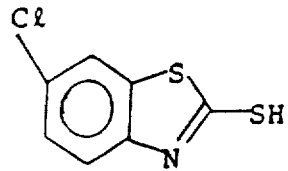

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(122)

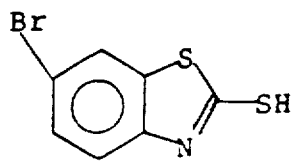

(123)

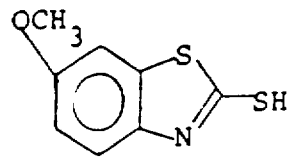

(124)

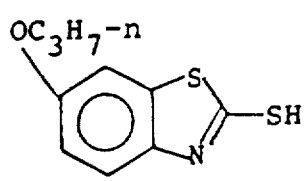

(125)

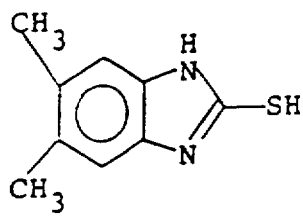

(126)

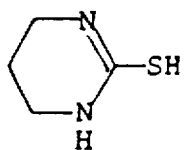

(127)

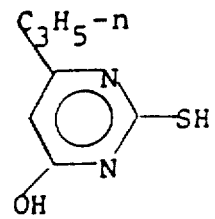

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(128)
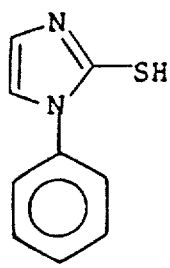

(129)
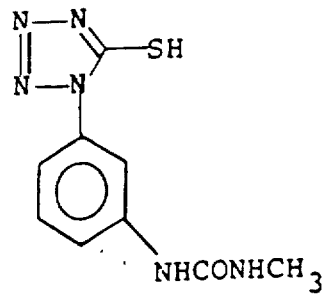

(130)
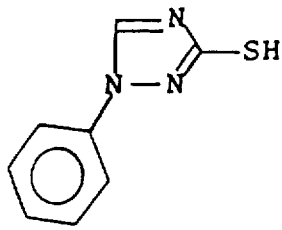

(131)
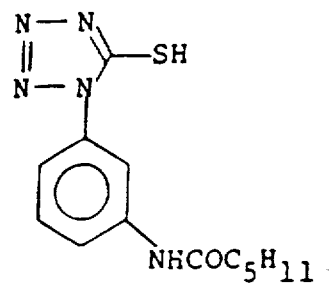

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(132)

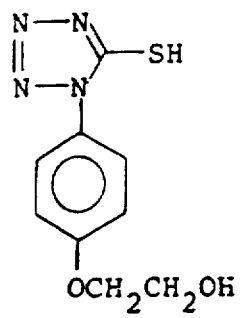

(133)

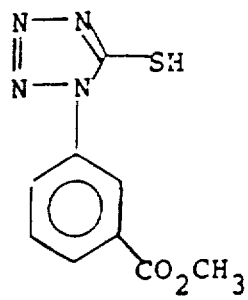

(134)

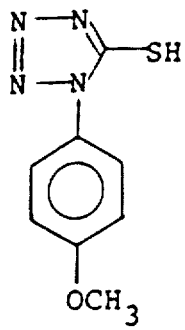

(135)

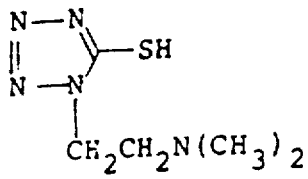

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(136)

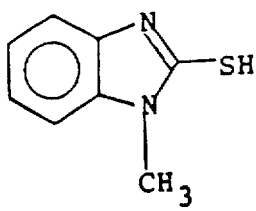

(137)

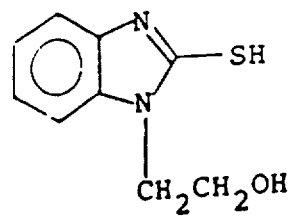

(138)

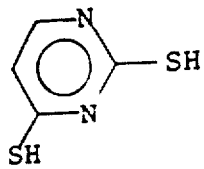

(139)

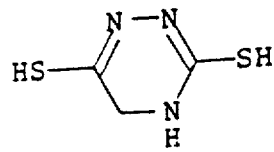

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(140)

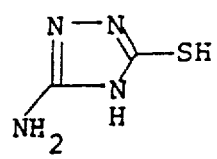

(141)

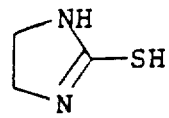

(142)

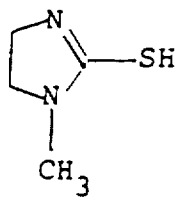

(143)

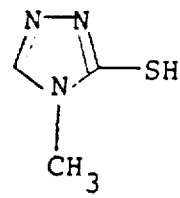

UNITED STATES PATENT AND TRADEMARK OFFICE
CERTIFICATE OF CORRECTION

PATENT NO. : 4,956,260  
DATED : September 11, 1990  
INVENTOR(S) : Koichi NAKAMURA Page 13 of 15

It is certified that error appears in the above-identified patent and that said Letters Patent is hereby corrected as shown below:

(144)

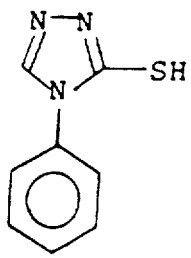

(145)

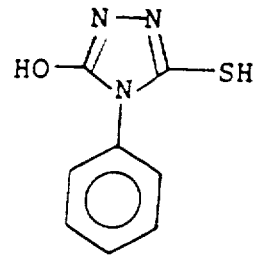

(146)

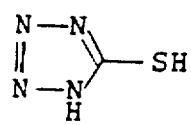

(147)

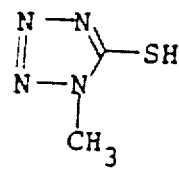

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

The title page, showing the illustrative figure, should be deleted and substitute the attached title page therefor.

(148)

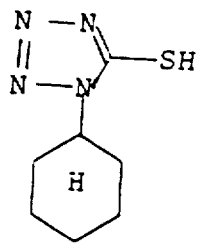

(149)

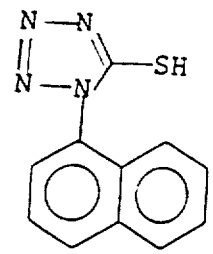

(150)

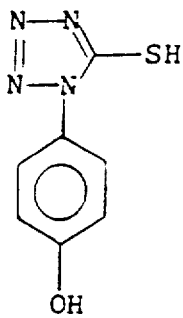

(151)

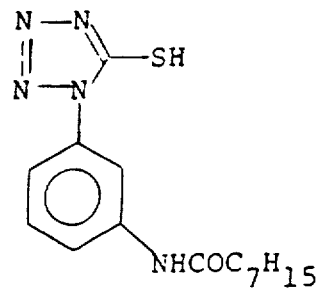

UNITED STATES PATENT AND TRADEMARK OFFICE
CERTIFICATE OF CORRECTION

PATENT NO. : 4,956,260

DATED : September 11, 1990

INVENTOR(S) : Koichi NAKAMURA

It is certified that error appears in the above-identified patent and that said Letters Patent is hereby corrected as shown below:

(152)

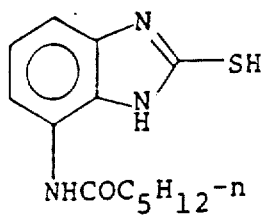

$NHCOC_5H_{12}$-n

--.

Signed and Sealed this

Sixteenth Day of June, 1992

Attest:

DOUGLAS B. COMER

Attesting Officer  Acting Commissioner of Patents and Trademarks